United States Patent
Huang

(10) Patent No.: US 8,018,301 B2
(45) Date of Patent: Sep. 13, 2011

(54) MICRO-ELECTRO-MECHANICAL TRANSDUCER HAVING A SURFACE PLATE

(75) Inventor: Yongli Huang, San Jose, CA (US)

(73) Assignee: Kolo Technologies, Inc., San Jose, CA (US)

( * ) Notice: Subject to any disclaimer, the term of this patent is extended or adjusted under 35 U.S.C. 154(b) by 0 days.

(21) Appl. No.: 13/018,162

(22) Filed: Jan. 31, 2011

(65) Prior Publication Data

US 2011/0136284 A1   Jun. 9, 2011

Related U.S. Application Data

(60) Division of application No. 12/568,225, filed on Sep. 28, 2009, now Pat. No. 7,880,565, which is a continuation of application No. 11/462,333, filed on Aug. 3, 2006, now Pat. No. 7,612,635.

(60) Provisional application No. 60/705,606, filed on Aug. 3, 2005.

(51) Int. Cl.
*H03H 7/00* (2006.01)
*H03H 7/01* (2006.01)

(52) U.S. Cl. ......... 333/186; 333/193; 333/204; 438/51; 438/53

(58) Field of Classification Search .................. None
See application file for complete search history.

(56) References Cited

U.S. PATENT DOCUMENTS

| | | | |
|---|---|---|---|
| 2,975,307 A | 3/1961 | Schroeder et al. | |
| 5,578,976 A | 11/1996 | Yao | |
| 5,894,452 A | 4/1999 | Ladabaum et al. | |
| 6,002,117 A | 12/1999 | Pak | |
| 6,004,832 A | 12/1999 | Haller et al. | |
| 6,271,620 B1 | 8/2001 | Ladabaum | |
| 6,283,601 B1 | 9/2001 | Hagelin et al. | |
| 6,384,353 B1 | 5/2002 | Huang et al. | |
| 6,424,165 B1 | 7/2002 | de Boer et al. | |
| 6,473,361 B1 | 10/2002 | Chen et al. | |
| 6,503,847 B2 | 1/2003 | Chen et al. | |
| 6,600,587 B2 | 7/2003 | Sniegowski et al. | |
| 6,700,688 B2 | 3/2004 | Vaganov | |
| 6,858,653 B1 | 2/2005 | Bessette | |
| 6,956,389 B1 | 10/2005 | Mai | |
| 7,321,185 B2 | 1/2008 | Schultz | |
| 7,489,593 B2 * | 2/2009 | Nguyen-Dinh et al. | ...... 367/181 |
| 2002/0031294 A1 | 3/2002 | Takeda et al. | |
| 2002/0041220 A1 | 4/2002 | Nguyen | |
| 2002/0074670 A1 | 6/2002 | Suga | |
| 2002/0096488 A1 | 7/2002 | Gulvin et al. | |
| 2002/0149071 A1 | 10/2002 | Shim | |

(Continued)

FOREIGN PATENT DOCUMENTS

WO    WO2004084300  A1    9/2004

*Primary Examiner* — Anh Q Tran
(74) *Attorney, Agent, or Firm* — Lee & Hayes, PLLC

(57) ABSTRACT

A micro-electro-mechanical transducer (such as a cMUT) is disclosed. The transducer has a base, a spring layer placed over the base, and a mass layer connected to the spring layer through a spring-mass connector. The base includes a first electrode. The spring layer or the mass layer includes a second electrode. The base and the spring layer form a gap therebetween and are connected through a spring anchor. The mass layer provides a substantially independent spring mass contribution to the spring model without affecting the equivalent spring constant. The mass layer also functions as a surface plate interfacing with the medium to improve transducing performance. Fabrication methods to make the same are also disclosed.

15 Claims, 22 Drawing Sheets

U.S. PATENT DOCUMENTS

| | | |
|---|---|---|
| 2003/0157783 A1 | 8/2003 | Fonash et al. |
| 2004/0027671 A1 | 2/2004 | Wu et al. |
| 2004/0085858 A1 | 5/2004 | Khuri-Yakub et al. |
| 2004/0250625 A1 | 12/2004 | Kogan et al. |
| 2005/0046504 A1 | 3/2005 | Xiaoyu et al. |
| 2005/0046922 A1 | 3/2005 | Lin et al. |
| 2005/0067919 A1 | 3/2005 | Horning |
| 2005/0075572 A1 | 4/2005 | Mills et al. |
| 2005/0146241 A1 | 7/2005 | Wan |
| 2005/0227400 A1 | 10/2005 | Chase et al. |
| 2005/0237858 A1 | 10/2005 | Thomenius et al. |
| 2005/0270128 A1 | 12/2005 | Nakanishi et al. |
| 2007/0074574 A1* | 4/2007 | Kogan et al. .......... 73/702 |
| 2007/0122074 A1 | 5/2007 | Kim et al. |

* cited by examiner

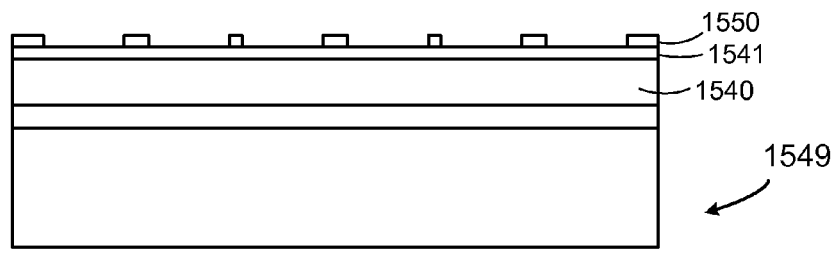
FIG. 15.1
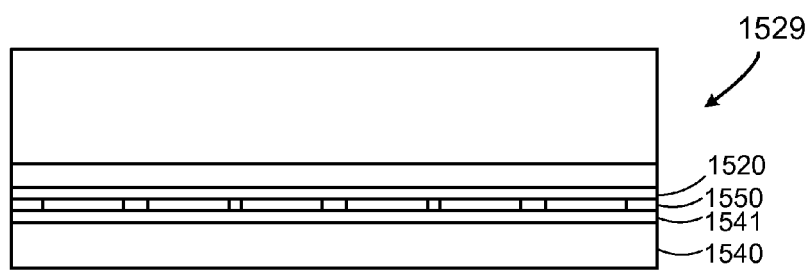
FIG. 15.2
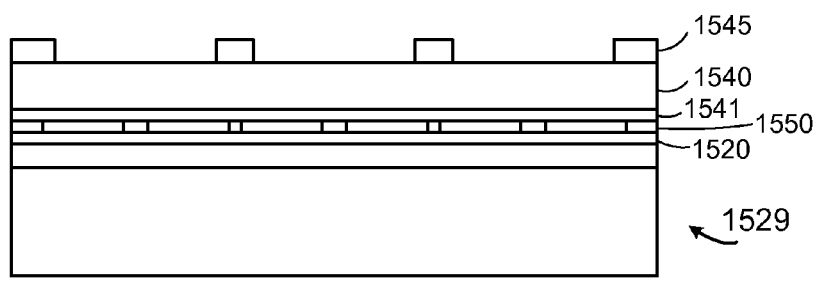
FIG. 15.3
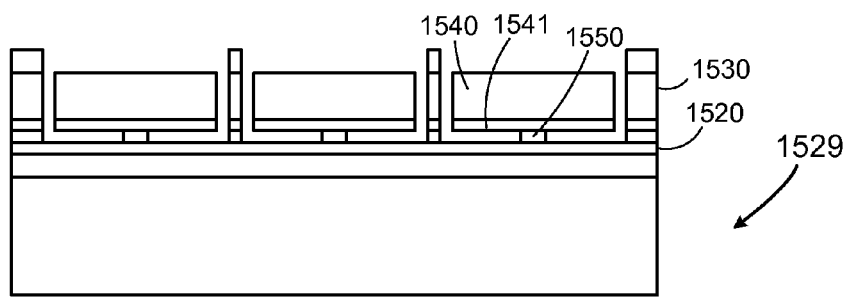
FIG. 15.4

FIG. 15.5
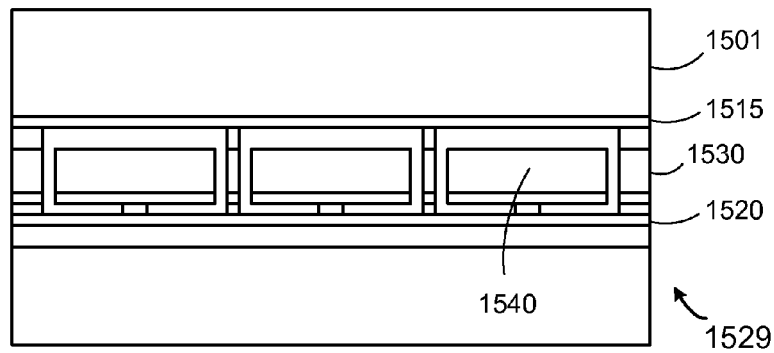
FIG. 15.6
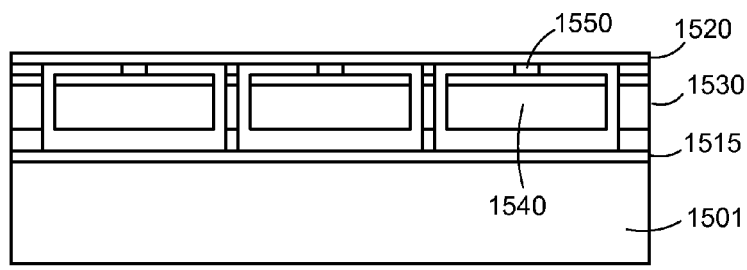
FIG. 15.7
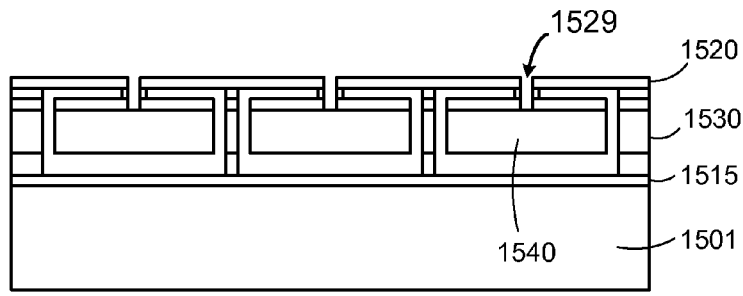
FIG. 15.8
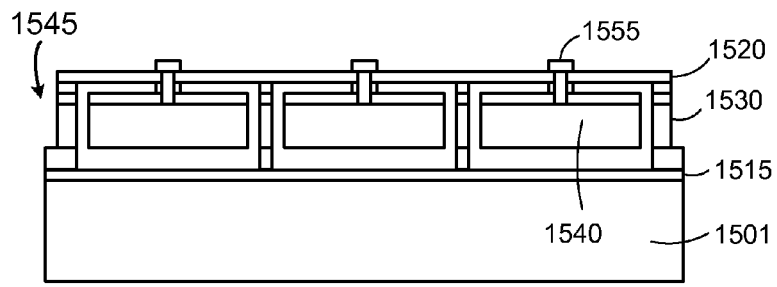

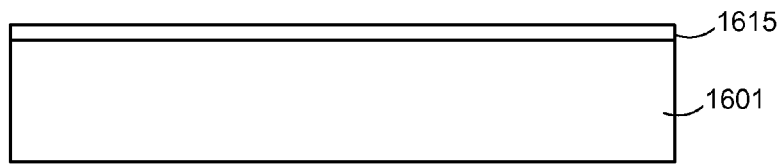
FIG. 16.1
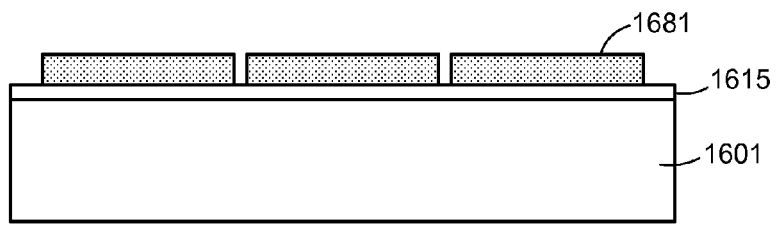
FIG. 16.2
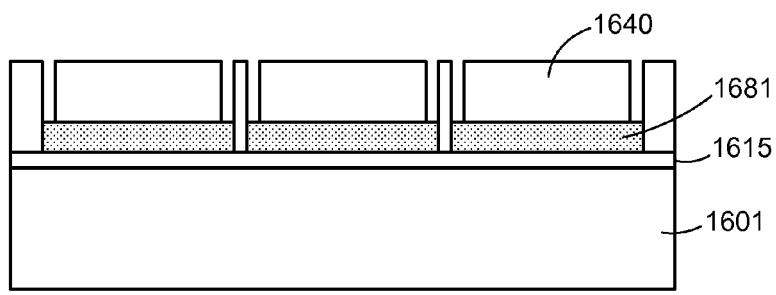
FIG. 16.3
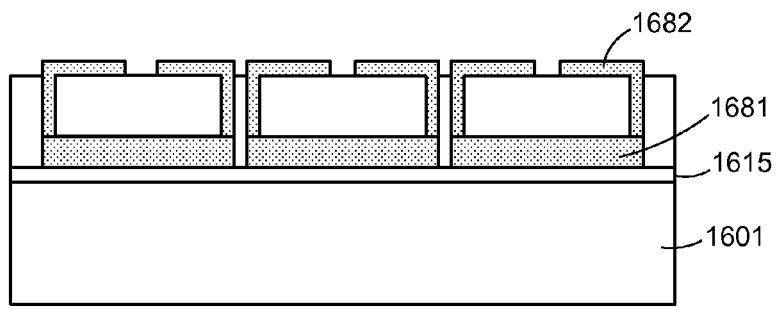
FIG. 16.4

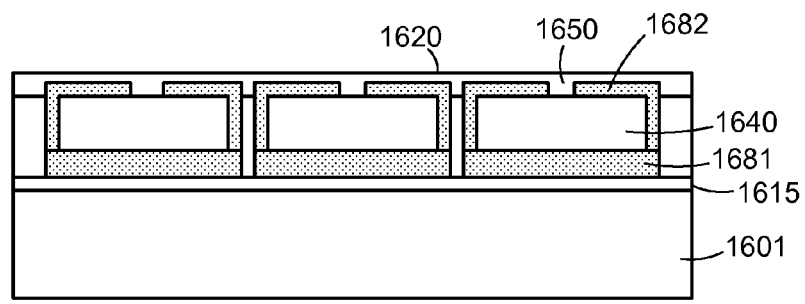
FIG. 16.5
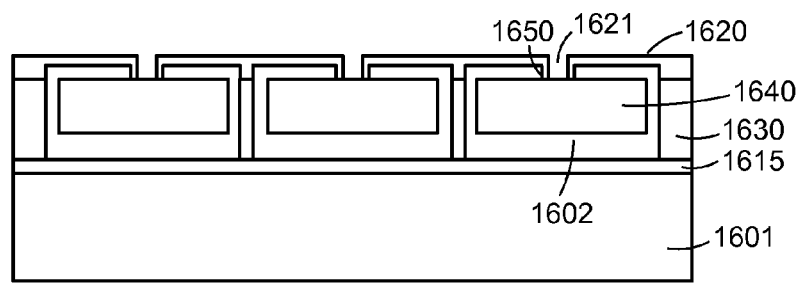
FIG. 16.6
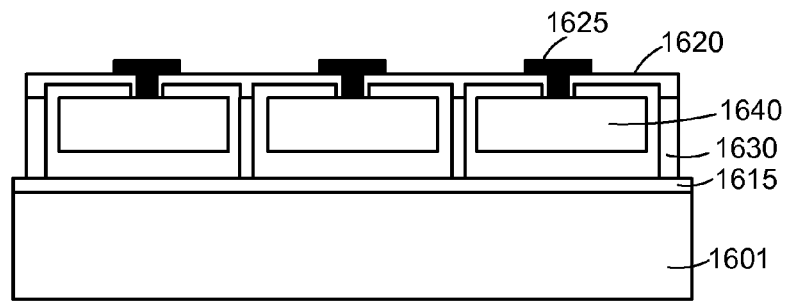
FIG. 16.7
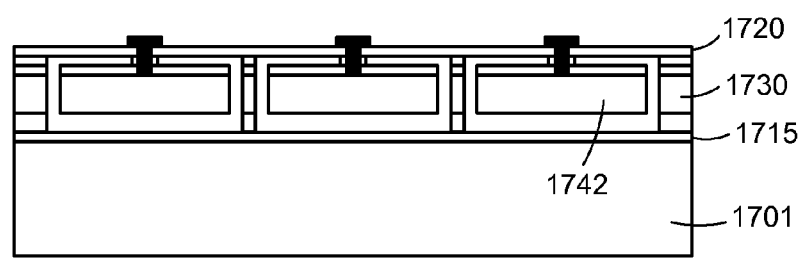
FIG. 17.1
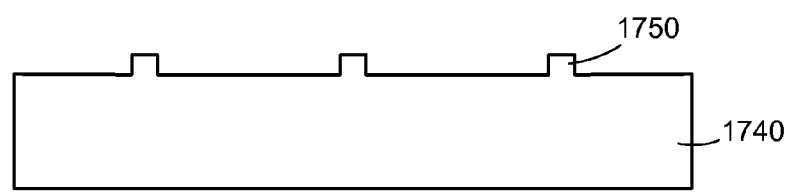
FIG. 17.2

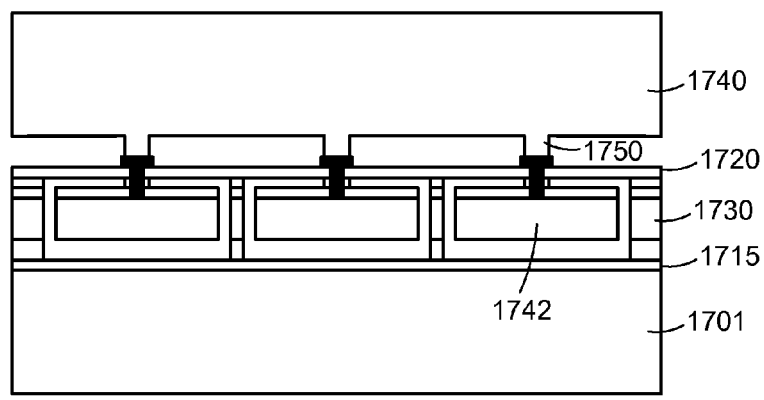
FIG. 17.3
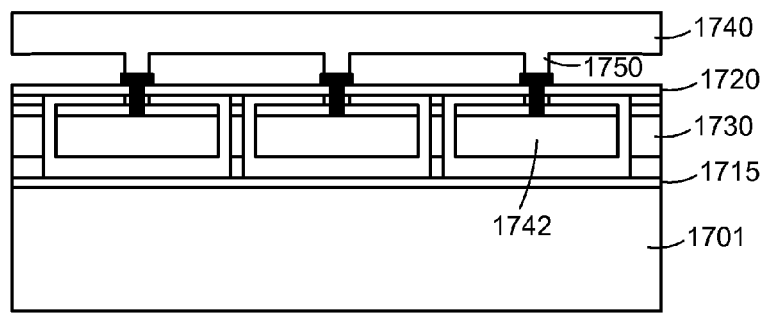
FIG. 17.4
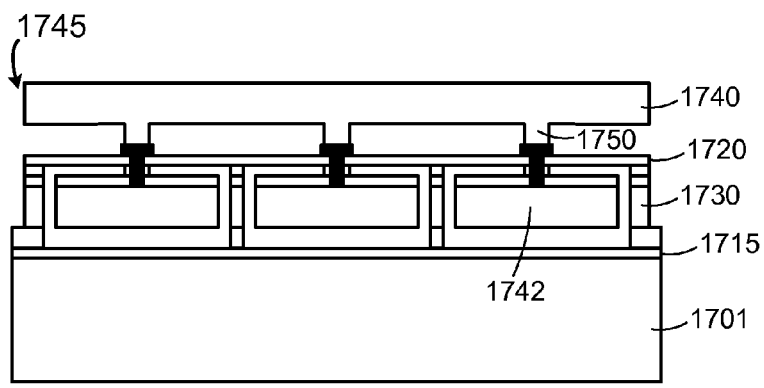
FIG. 17.5

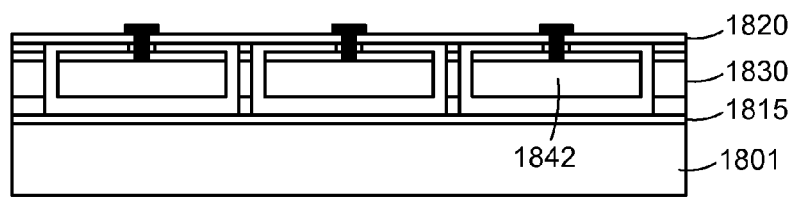
FIG. 18.1
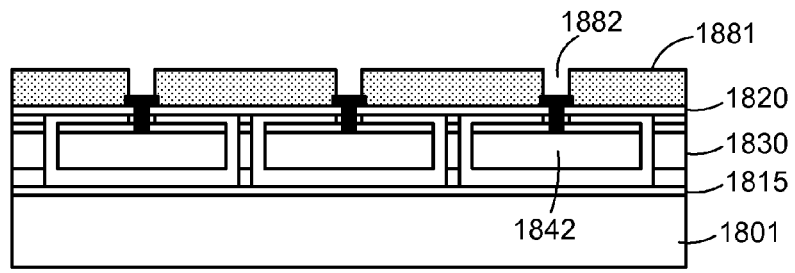
FIG. 18.2
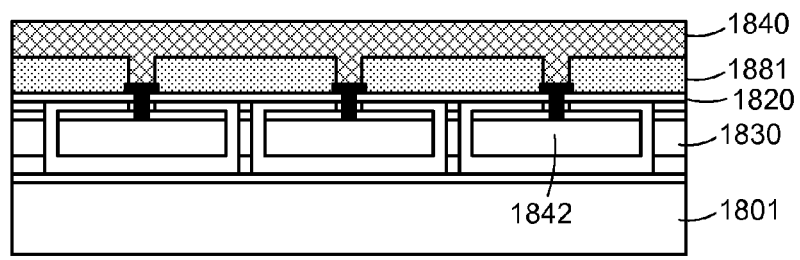
FIG. 18.3
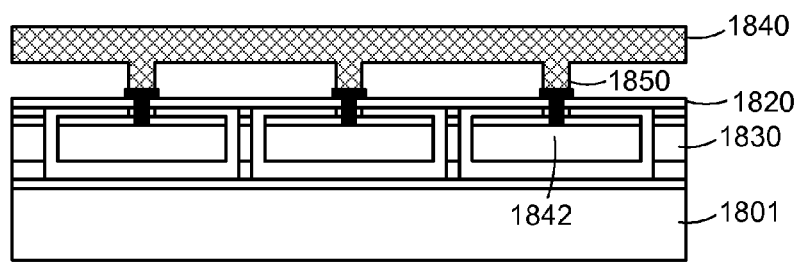
FIG. 18.4
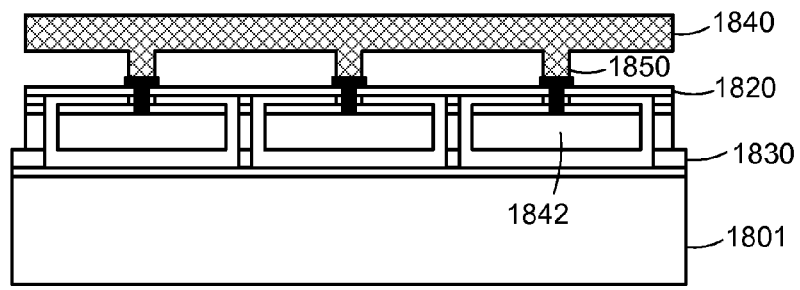
FIG. 18.5

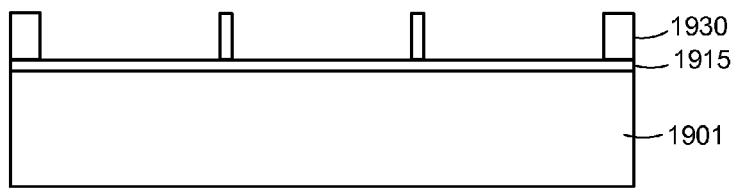
FIG. 19.1
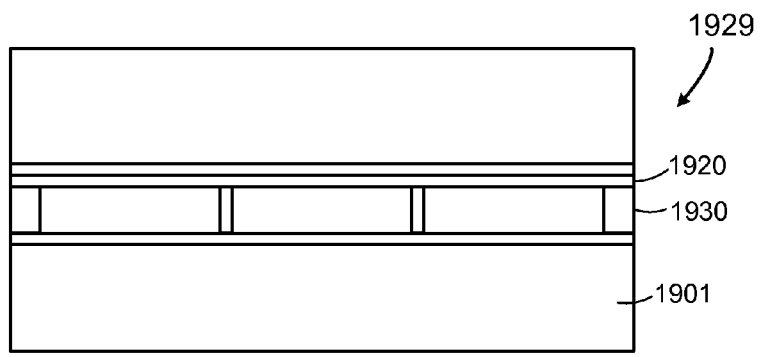
FIG. 19.2
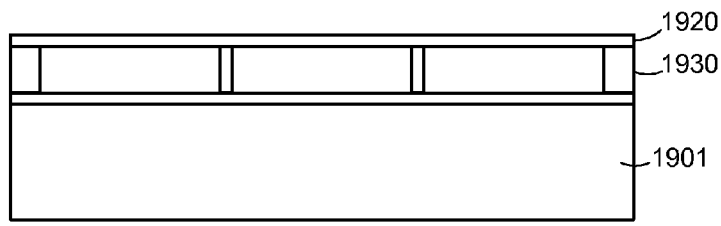
FIG. 19.3
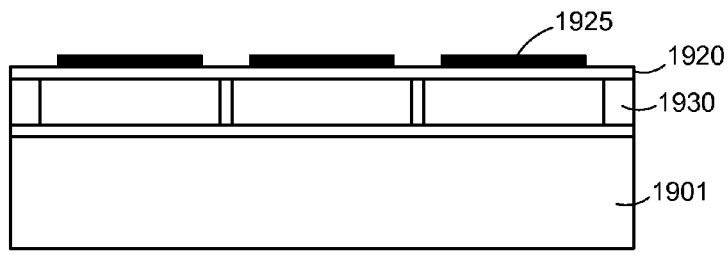
FIG. 19.4

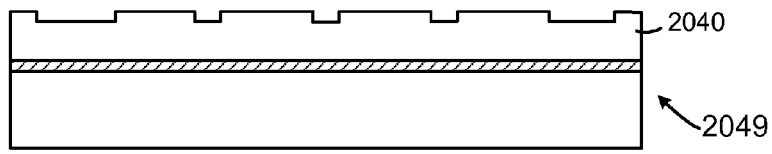
FIG. 20.1
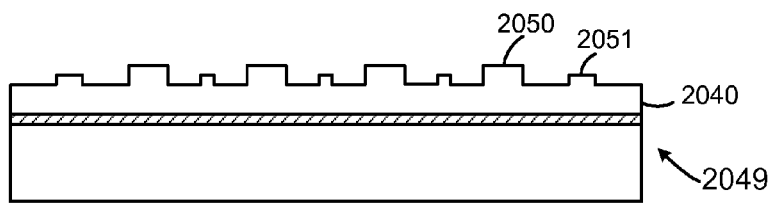
FIG. 20.2
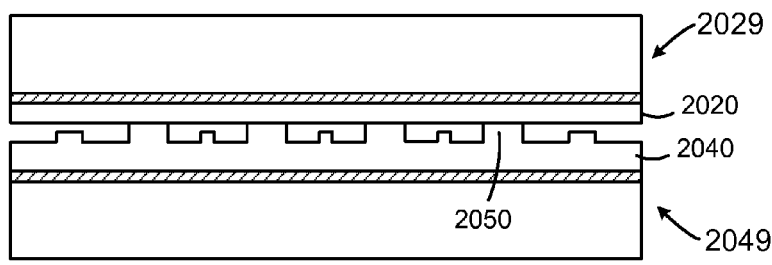
FIG. 20.3
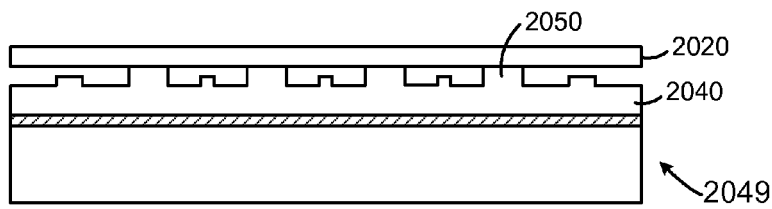
FIG. 20.4
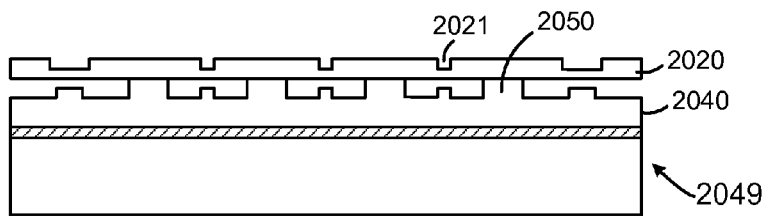
FIG. 20.5

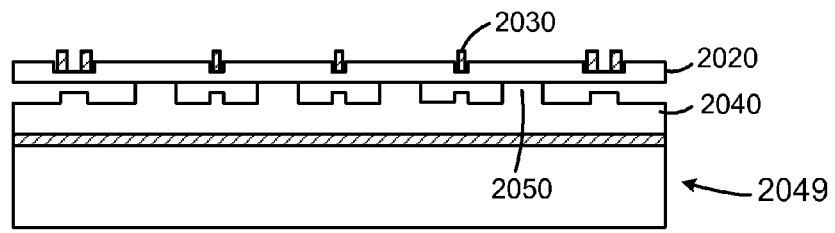
FIG. 20.6
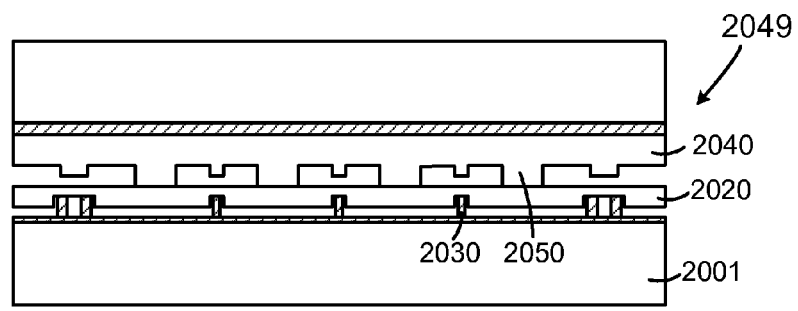
FIG. 20.7
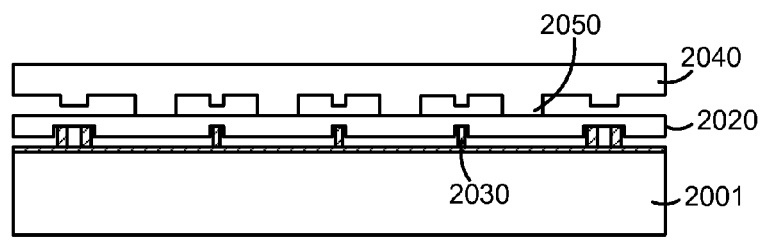
FIG. 20.8
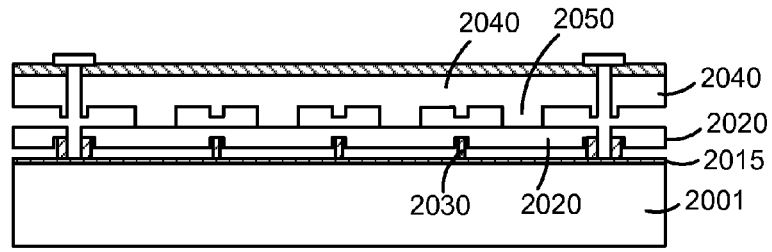
FIG. 20.9

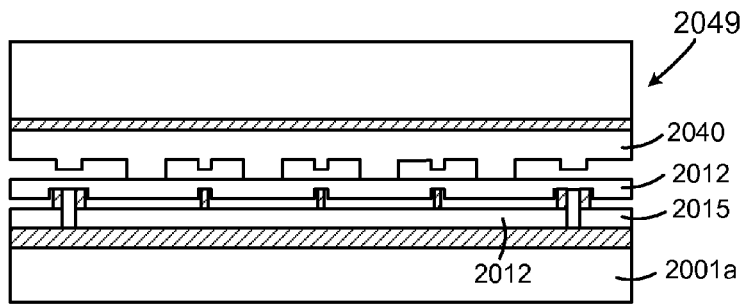
FIG. 20.7a
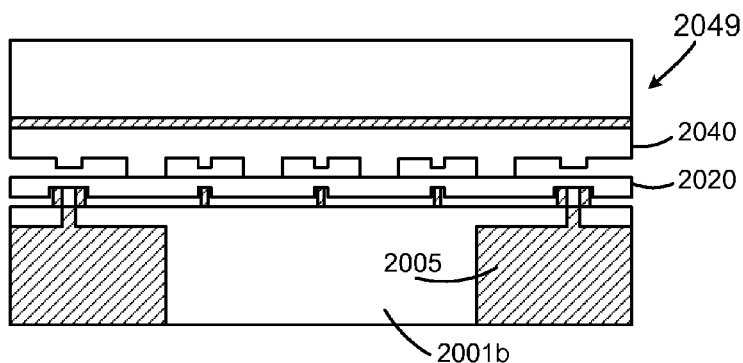
FIG. 20.7b
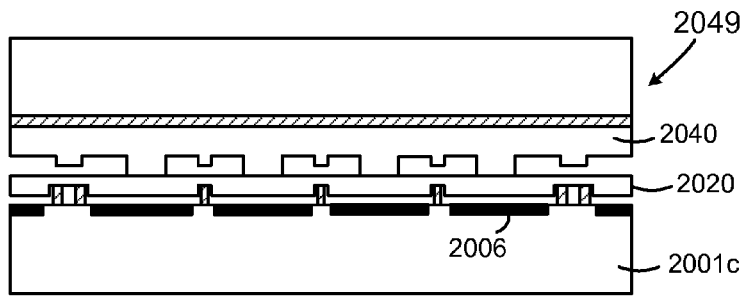
FIG. 20.7c
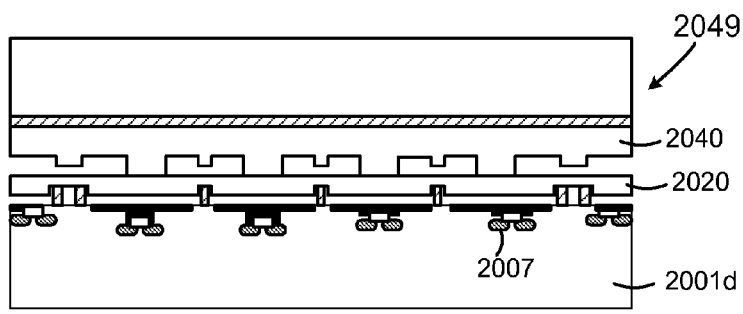
FIG. 20.7d FIG. 21.1 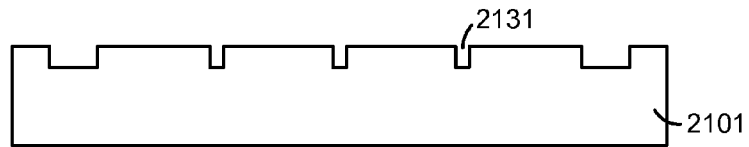
FIG. 21.2 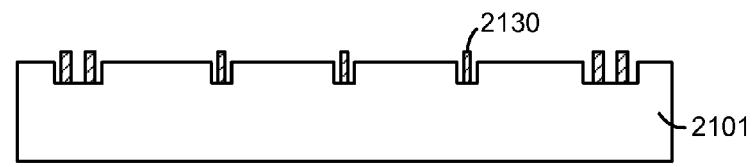
FIG. 21.3 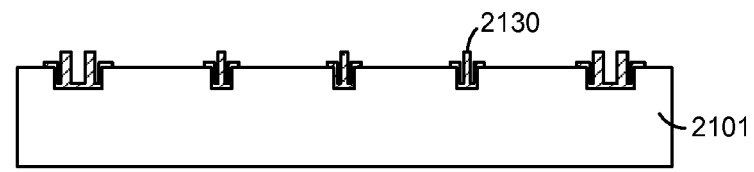
FIG. 21.4 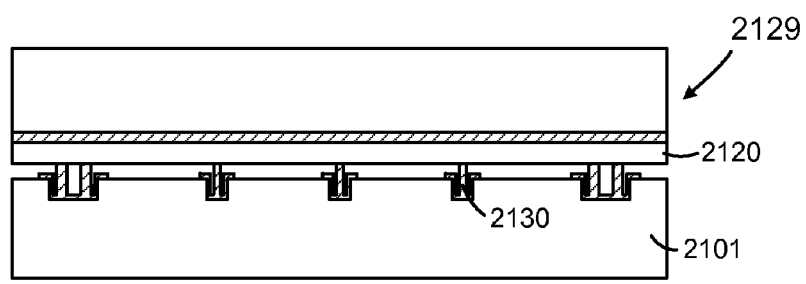
FIG. 21.5 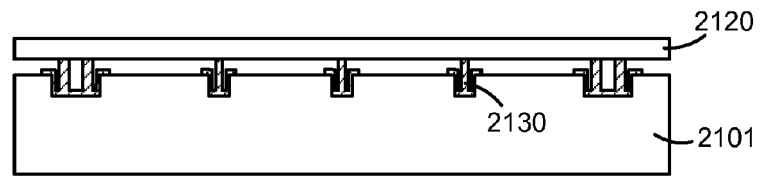

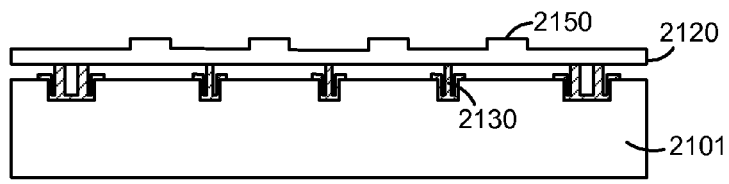
FIG. 21.6
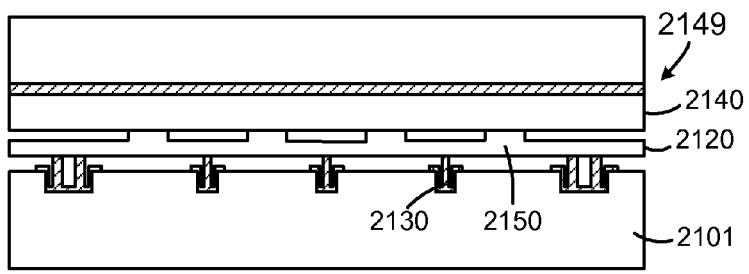
FIG. 21.7
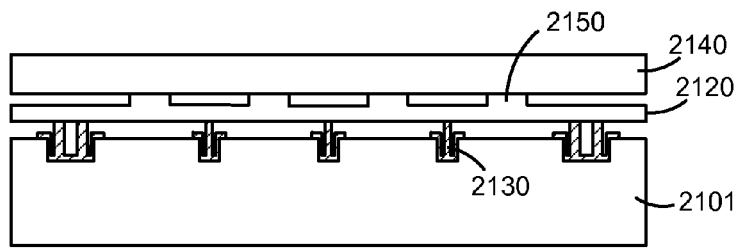
FIG. 21.8
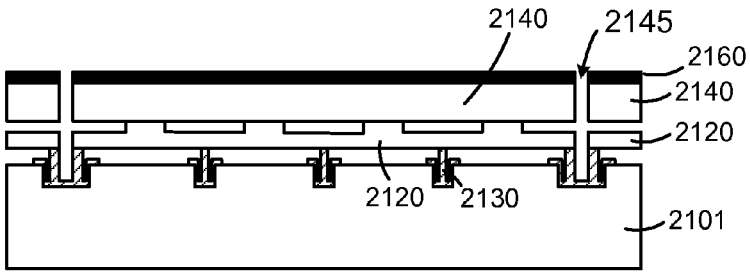
FIG. 21.9

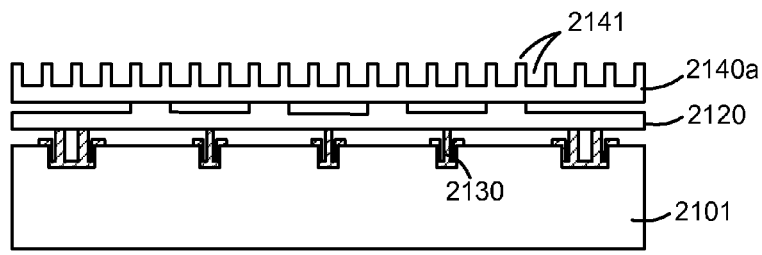
FIG. 21.8a
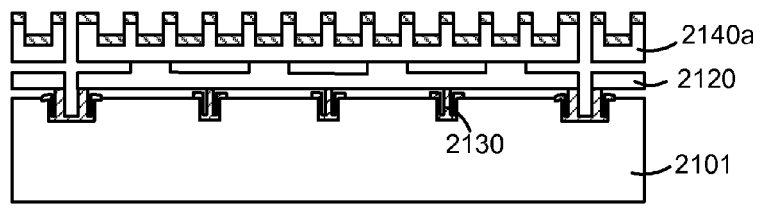
FIG. 21.9a
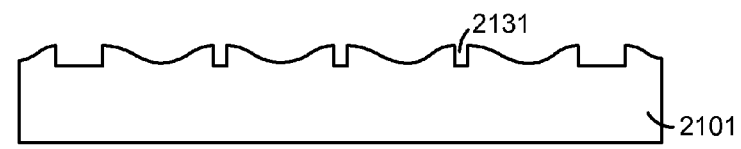
FIG. 21.1a
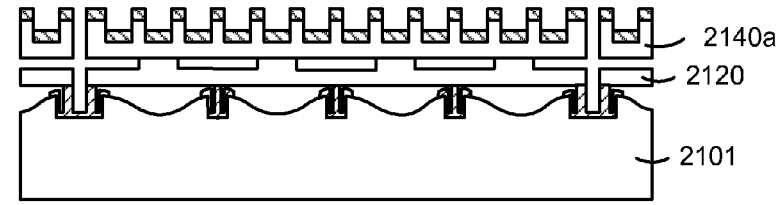
FIG. 21.9b

MICRO-ELECTRO-MECHANICAL TRANSDUCER HAVING A SURFACE PLATE

CROSS REFERENCE TO RELATED PATENT APPLICATIONS

This application is a divisional application of U.S. patent application Ser. No. 12/568,225, filed Sep. 28, 2009, which is a continuation of U.S. patent application Ser. No. 11/462,333, filed Aug. 30, 2006, which in turn claims benefit under 35 USC 119(e) from U.S. Provisional Application Ser. No. 60/705,606, filed Aug. 3, 2005, which applications are incorporated herein by reference in their entirety.

This application further incorporates herein by reference in entirety the following:

International Application (PCT) No. PCT/IB2006/051566, entitled THROUGH-WAFER INTERCONNECTION, filed on May 18, 2006;

International Application (PCT) No. PCT/IB2006/051567, entitled METHODS FOR FABRICATING MICRO-ELECTRO-MECHANICAL DEVICES, filed on May 18, 2006;

International Application (PCT) No. PCT/IB2006/051568, entitled MICRO-ELECTRO-MECHANICAL TRANSDUCERS, filed on May 18, 2006;

International Application (PCT) No. PCT/IB2006/051569, entitled MICRO-ELECTRO-MECHANICAL TRANSDUCERS, filed on May 18, 2006;

International Application (PCT) No. PCT/IB2006/051948, entitled MICRO-ELECTRO-MECHANICAL TRANSDUCER HAVING AN INSULATION EXTENSION, filed on Jun. 16, 2006;

International Application (PCT) PCT/IB2006/052657, entitled MICRO-ELECTRO-MECHANICAL TRANSDUCER HAVING AN OPTIMIZED NON-FLAT SURFACE, filed on Aug. 3, 2006; and U.S. patent application Ser. No. 11/425,128, entitled FLEXIBLE MICRO-ELECTRO-MECHANICAL TRANSDUCER, filed on Jun. 19, 2006; and International Application (PCT) PCT/IB2006/052658, entitled MICRO-ELECTRO-MECHANICAL TRANSDUCER HAVING A SURFACE PLATE, filed on Aug. 3, 2006.

FIELD OF THE PRESENT DISCLOSURE

The present disclosure relates to micro-electro-mechanical devices that have a movable mechanical part to function as an acoustic filter, particularly to work with PZT transducers and micromachined ultrasonic transducers (MUT) such as capacitance micromachined ultrasonic transducers (cMUT).

BACKGROUND OF THE PRESENT DISCLOSURE

Acoustic filters play an important role in many acoustic applications. Ultrasonic filters are used to condition the ultrasonic signal to be more suitable for the applications of ultrasonic transducers such as PZT transducers and MUT transducers. For example, ultrasonic filters can be used to shape the frequency bandwidth of the transducer, introduce desired phase delay and serve as the matching layer or the backing layer of the transducer. Usually the conventional ultrasonic filters are made of one layer or multiple layers of materials with desired thickness and acoustic properties.

In ultrasound imaging applications (such as ultrasonic non-destructive tests and ultrasonic diagnosis), for example, proper filtering is essential to obtain a good range of resolution. Transducer sensitivity and bandwidth are generally improved by adding single or multiple quarter-wave length matching layers between the transducer and the load medium, and this in turn reduces losses between the transducer and load medium. A matching layer is a thin layer of material placed on the front surface of an ultrasound transducer to improve the transfer of ultrasound into the medium of propagation (e.g. soft tissue). The thickness of the layer is usually equal to one fourth the wavelength of the ultrasound in the matching layer (the so-called quarter-wave matching), and the acoustic impedance is often about the geometric mean of the impedances on each side of the matching layer for effective matching. Multiple matching layers have also been used because using multiple layers with decreasing impedance provides a more gradual transition from the high impedance of the element to the low impedance of the body. In addition to matching layers in the front of the transducer, acoustic backing materials are also used at the back of the transducer to block ultrasound leaking into the substrate.

Conventional acoustic filters having one or more material layers have been used with a variety of ultrasound transducers, including piezoelectric transducers (PZT) and micromachined ultrasonic transducers. An ultrasound transducer performs a chain of energy transformation to realize its function of a transducer. In its receiving mode, the acoustic energy of ultrasound waves propagating in a medium where the transducer is placed is transformed to mechanical energy of a movable part (conventionally a vibrating membrane) in the transducer. The motion of the movable part is then transformed to a detectable electromagnetic (usually electrical) signal. In its transmitter mode, the reverse chain of energy transformation takes place.

Various types of ultrasonic transducers have been developed for transmitting and receiving ultrasound waves. Ultrasonic transducers can operate in a variety of media including liquids, solids and gas. These transducers are commonly used for medical imaging for diagnostics and therapy, biochemical imaging, non-destructive evaluation of materials, sonar, communication, proximity sensors, gas flow measurements, in-situ process monitoring, acoustic microscopy, underwater sensing and imaging, and many others. In addition to discrete ultrasound transducers, ultrasound transducer arrays containing multiple transducers have been also developed. For example, two-dimensional arrays of ultrasound transducers are developed for imaging applications.

Compared to the widely used piezoelectric (PZT) ultrasound transducer, the MUT has advantages in device fabrication method, bandwidth and operation temperature. For example, making arrays of conventional PZT transducers involves dicing and connecting individual piezoelectric elements. This process is fraught with difficulties and high expenses, not to mention the large input impedance mismatch problem presented by such elements to transmit/receiving electronics. In comparison, the micromachining techniques used in fabricating MUTs are much more capable in making such arrays. In terms of performance, the MUT demonstrates a dynamic performance comparable to that of PZT transducers. For these reasons, the MUT is becoming an attractive alternative to the piezoelectric (PZT) ultrasound transducers.

Among the several types of MUTs, the capacitive micromachined ultrasonic transducer (cMUT), which uses electrostatic transducers, is widely used. Other MUTs using piezoelectric (pMUT) and magnetic (mMUT) transducers are also adopted.

In general, both matching layers and backing layers are needed for PZT transducer because the significant mismatch of the acoustic impedance between the PZT material and the medium. One of the major disadvantages of the PZT transducer is the narrow bandwidth. A matching layer and a backing layer are therefore usually needed to improve the bandwidth of a PZT. For cMUT, there is usually less need for such layers, especially the matching layer, because the cMUT have better impedance match with the medium and can often exchange energy with the medium without the match layer. However, even cMUT may still benefit from acoustic filtering designed for other purposes.

In the prior art, the matching layer and backing layer is usually a single or multiple layers of special materials with particular acoustic impedances and precise thicknesses. For multiple layers, different types of materials are often needed for different layers. Often, finding a material with exactly acoustic impedance and coating a layer to the exactly thickness can be a challenge for just a single layer, especially for a high frequency transducers, 2D transducer arrays or IVUS side-view transducers, and much more so for multiple layers of high order filtering.

SUMMARY OF THE PRESENT DISCLOSURE

This application discloses a micro-electro-mechanical transducer (such as a cMUT) that has a movable mechanical part to transform energy. The transducer has a mass layer connected to a spring layer through a spring-mass connector. The spring layer is connected to a base through a spring anchor. The mass layer provides a substantially independent spring mass contribution to the spring model without affecting the equivalent spring constant. The mass layer may be a rigid plate to function as a surface plate interfacing with the medium to improve transducing performance. The spring anchor may either be an extended peripheral wall defining the boundary of a cMUT cell, or distributed across the transducer area. A variety of configurations with respect to the shape and distribution of the connectors are possible.

According to one aspect of the present disclosure, a micro-electro-mechanical transducer has a base including a first electrode; a spring layer connected to the base through a spring anchor to form a cantilever; and a mass layer connected to the spring layer through a spring-mass connector. In one embodiment, the spring anchor separates at least a part of the spring layer from the base to form a gap therebetween. The spring layer or the mass layer includes a second electrode. The base may include a substrate. The first electrode may either be a separate conductive layer added to the substrate, or a part of a conductive substrate.

Preferably, the spring-mass connector has an area size substantially smaller than that of the mass layer such that the mass layer may not substantially affect the spring constant of the spring layer. To improve the efficiency of the transducer, the spring anchor preferably has a minimized footprint.

In some embodiments, the mass layer is disposed between the spring layer and the base. The second electrode may be either disposed on the mass layer or is an integral part of the mass layer if the mass layer is conductive. The base may also include an insulation layer on top of the first electrode.

In other embodiments, the mass layer is disposed above the spring layer, and the spring layer is disposed between the mass layer and the base. The second electrode may either be disposed on the spring layer or be an integral part of the spring layer if the spring layer is conductive.

In one embodiment, the spring anchor is a support wall defining a peripheral of a transducer element. An example of such embodiment is an application of the concept of the present disclosure in conventional cMUTs having a flexible membrane fixed on a peripheral wall.

The spring anchor may be integral with the base. The spring anchor may comprise an electrically insulating material. The mass layer may be designed to be significantly more rigid than the spring layer. A rigid mass layer may be particularly advantageous when functioning as a surface plate to interface with a medium in operation of the transducer. The mass layer may have a mass optimized for an operating frequency of the transducer. The mass layer preferably has a surface area optimized for efficient interface with the medium.

In some embodiments, the transducer has at least one individually addressed transducer element, wherein each transducer element comprises a plurality of spring anchors. The plurality of spring anchors may be distributed across the respective transducer element such that there is at least one spring anchor is located away from a peripheral of the transducer element.

In one embodiment, the spring-mass connector is located at a position where the spring layer is likely to experience a maximum displacement. In other embodiments, the base also includes an insulation layer on top of the first electrode. The base may comprise a non-flat top surface facing the spring layer. In one embodiment, the non-flat top surface of the base has at least two steps having different heights. In another embodiment, the non-flat top surface of the base comprises a curved region.

The base may comprise a through wafer interconnection, a layer having printed circuits, or an integrated circuit. The mass layer may have a holed or hallow structure or a honeycomb structure to improve performance.

In one embodiment, the spring anchor comprises an insulation extension extending into at least one of the base and the spring layer to improve the insulation performance without increasing the electrode gap.

Another aspect of the present disclosure is a micro-electro-mechanical transducer that has a base including a first electrode; a spring layer connected to the base; and a mass layer. The base and the spring layer are connected through a first spring anchor and a second spring anchor which separate at least a part of the spring layer from a part of the base to form a gap therebetween. The mass layer is connected to the spring layer through a spring-mass connector. At least one of the spring layer and the mass layer includes a second electrode, and the spring-mass connector is horizontally distanced from both the first and the second spring anchors to enable a vertical displacement of the spring-mass connector to transport the mass layer substantially vertically.

In one embodiment, the base and the spring layer are connected through a plurality of spring anchors and the mass layer is connected to the spring layer through a plurality of spring-mass connectors, wherein the each spring-mass connector is horizontally distanced from neighboring spring anchors to enable a vertical displacement of the plurality of spring-mass connectors to transport the mass layer substantially vertically.

In one embodiment, the mass layer is disposed above the spring layer and the base is disposed below the spring layer. A supplemental layer may be further placed below the spring layer and connected to the spring layer. The supplemental layer may be a conductive layer. The supplemental layer may also be connected to the spring layer through a connector.

In one embodiment, at least one of the first and the second spring anchors is an elongated wall. In other embodiments, the mass layer comprises a silicon or polysilicon material. The base may be conductive. To increase reliability, the vertical displacement of the connector may be limited by a motion stopper disposed between the spring layer and the mass layer.

According to another aspect of the present disclosure, the micro-electro-mechanical transducer comprises a base including a first electrode; a spring layer connected to the base; and a mass layer. The base and the spring layer are connected through a spring anchor which separates at least a part of the spring layer from a part of the base to form a gap therebetween. The mass layer is connected to the spring layer through a first spring-mass connector and a second spring-mass connector. At least one of the spring layer and the mass layer includes a second electrode, and the first and the second spring-mass connectors are each horizontally distanced from the spring anchor to enable a vertical displacement of the first and the second spring-mass connectors to transport the mass layer substantially vertically.

In one embodiment, the base comprises a conductive layer, and the spring anchor comprises an insulation material extending into the conductive layer to form an insulation extension.

According to another aspect of the present disclosure, a micro-electro-mechanical transducer comprises at least one addressable transducer element having a periphery defining a transducer element area. The addressable transducer element comprises a base including a first electrode; a spring layer placed over the base; and a mass layer. The base and the spring layer are connected through a plurality of spring anchors which separate at least a part of the spring layer from the base to form a gap therebetween. The mass layer is connected to the spring layer through a plurality of spring-mass connectors. At least one of the spring layer and the mass layer includes a second electrode. The plurality of spring anchors are each horizontally distanced from the neighboring spring-mass connector to allow the plurality of spring-mass connectors to displace vertically thus transporting the mass layer in the same direction.

The micro-electro-mechanical transducer of may include a plurality of addressable transducer elements separated from each other by trenches form through the mass layer.

In one embodiment, each of the plurality of spring-mass connectors defines a spring comprising a cantilever anchored at the neighboring spring anchors. The springs define an effective spring intensity profile indicating spring strength per area location. The effective spring intensity may be substantially uniform over the device element area. The effective spring intensity may be nonuniform. For example, the spring intensity near a perimeter of the device element area may be significantly higher than that at locations near a center of the device element area.

The mass layer in the addressable transducer element may have a thickness profile including at least two different thicknesses. The mass layer may comprise holes formed therein. The holes may have a size and location profile optimized for a desired rigidity/mass ratio of the top mass layer.

The micro-electro-mechanical transducer in accordance with the present disclosure may be based on a variety of transducing mechanisms. One important example is a capacitive micromachined ultrasonic transducer (cMUT).

Yet another aspect of the present disclosure is a method for fabricating a micro-electro-mechanical device having a movable mechanical part to transform energy. The method comprising the steps of: (1) forming at least one spring anchor on either a front side of a substrate wafer or a bottom side of a spring layer; (2) forming at least one spring-mass connector of a desired height either on the spring layer or on a mass layer; and (4) joining the substrate wafer the spring layer and the mass layer such that the spring layer and the substrate wafer are joined through the spring anchor to define a gap therebetween, the mass layer and the spring layer are joined through the spring-mass connector.

In one embodiment, the spring-mass connector is horizontally distanced from the spring anchor by a sufficient length to define a cantilever anchored at the spring anchor with an exerting end at the spring-mass connector. The cantilever and the gap enable a vertical displacement of the spring-mass connector to transport the mass layer substantially vertically with a piston-like motion.

In one embodiment, the spring-mass connector is formed on a top side of the spring layer, and the mass layer is connected to the spring-mass connector from the top side of the spring layer opposing the substrate wafer. In another embodiment, the spring-mass connector is formed on the bottom side of the spring layer, and the mass layer is connected to the spring-mass connector from the bottom side of the spring layer. The mass layer may be disposed in the gap defined by the spring layer and the substrate wafer.

The step of forming at least one spring anchor may be accomplished in a number of ways. In one embodiment, this step comprises depositing and patterning a material on the spring layer to form the at least one spring anchor. In another embodiment, this step comprises growing and patterning an oxide on the spring layer to form the at least one spring anchor. In another embodiment, this step comprises forming a recess on the spring layer; and growing and patterning an oxide on the spring layer to form the at least one spring anchor in the recess. The spring anchor is attached to a bottom of the recess and extends beyond the spring layer.

The step of forming at least one spring-mass connector may also be accomplished in a number of ways. In one embodiment, this step comprises depositing and patterning a material on the mass layer to form the at least one spring-mass connector. In another embodiment, this step comprises patterning and micromachining the mass layer to form the at least one spring-mass connector on the mass layer. In yet another embodiment, this step comprises (1) forming a sacrificial layer on the mass layer, the sacrificial layer defining a negative pattern for the spring-mass connector; (2) depositing a material over the sacrificial layer and into the negative pattern for the spring-mass connector; and (3) removing the sacrificial layer to form the spring layer and the spring-mass connector.

In one embodiment, the method further comprises forming or effectuating a transducing member on the spring layer. For example, when used in an electrostatic transducer such as capacitive micromachined ultrasound transducer, the transducing member may be an electrode.

In one embodiment, the mass layer is disposed between the substrate and the spring layer, and the method further comprises forming or effectuating a transducing member on the mass layer.

The foregoing and other features and advantages will become more apparent from the following detailed description of several embodiments, which proceeds with reference to the accompanying figures.

BRIEF DESCRIPTION OF THE DRAWINGS

FIGS. 15.1-15.8 show a first exemplary fabrication process for making a micro-electro-mechanical transducer in accordance with the present disclosure.

FIGS. 16.1-16.7 show a second exemplary fabrication process for making a micro-electro-mechanical transducer in accordance with the present disclosure.

FIGS. 17.1-17.5 show a third exemplary fabrication process for making a micro-electro-mechanical transducer in accordance with the present disclosure.

FIGS. 18.1-18.5 show a fourth exemplary fabrication process for making a micro-electro-mechanical transducer in accordance with the present disclosure.

FIGS. 19.1-19.4 show an exemplary process for forming a precursor cMUT structure to be further processed using the fabrication methods in accordance with the present disclosure.

FIGS. 20.1-20.9, including supplemental FIGS. 20.7a, 20.7b, 20.7c and 20.7d, show a fifth exemplary fabrication process for making a micro-electro-mechanical transducer in accordance with the present disclosure.

FIGS. 21.1-21.9, including supplemental FIGS. 21.8a, 21.9a, 21.1a and 21.9b, show a sixth exemplary fabrication process for making a micro-electro-mechanical transducer in accordance with the present disclosure.

DETAILED DESCRIPTION

Figure 1A:
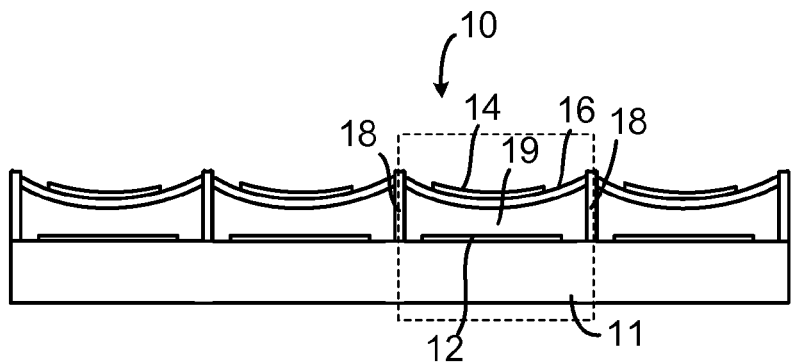
FIG. 1A shows a cross-sectional view of a basic structure of a prior art cMUT having multiple cells.

The micro-electro-mechanical transducer such as a capacitance micromachined ultrasonic transducer (cMUT) of the present disclosure will be described in detail along with the figures, in which like parts are denoted with like reference numerals or letters. The micro-electro-mechanical transducer may be fabricated using any suitable methods, particularly using the methods disclosed in several other patent applications identified and incorporated herein.

The present disclosure has been described below with reference to specific embodiments. In most cases, a cMUT structure is used to illustrate the present disclosure. It is appreciated, however, that the present disclosure is not limited to cMUTs. It will be apparent to those skilled in the art that various modifications may be made and other embodiments can be used without departing from the broader scope of the disclosures. Therefore, these and other variations upon the specific embodiments are intended to be covered by the present disclosures. Those skilled in the art will recognize that various features disclosed in connection with the embodiments may be used either individually or jointly.

It is noted that the terms "transducer" and "transducing member" are used in a broad sense in the present description to not only include devices that perform both actuation and sensing functions but also include devices that perform either an actuation function or an sensing function. It is also noted that the term "cantilever" is used in this description in a broad sense to describe a structure that has an anchored end, a resilient portion extending from the anchored, and to an exerting end to activate or move the resilient portion. A cantilever thus does not necessarily suggest a literal one-dimensional bema-like cantilever, but also includes similar structures have multibeams extending in different directions such as a bridge, or a crossbar, and most definitely also includes area or plane springs (two-dimensional "cantilevers") in which the anchored end is an extended line which may be a closed perimeter of an area or a portion thereof, the resilient portion is an extended area, and the exerting end may be a single point, a small area, or an extended line (close ended, open-ended, or segmented). In addition, the words "circular" and "annular" only suggest in the broadest sense that a shape has a looped form, a curved shape that is nearly looped, or an arrangement that is generally shaped like a ring, and do not suggest a rounded shape or any other shape in particular, nor does it suggest that the loop or ring is entirely complete or unbroken.

In this document, a conductive material is defined as one having a resistivity less than $1\times10^4$ Ω-cm. Silicon and polysilicon materials are therefore considered conductive materials in this context. A good conductive material preferably has a resistivity less than 1 Ω-cm. The terms "insulation material", "insulating material" and "dielectric material" are used interchangeably unless noted otherwise, and are defined as one having a resistivity greater than $1\times10^4$ Ω-cm. A good insulation/insulating material preferably has a resistivity greater than $1\times10^8$ Ω-cm. An insulator generally comprises an insulating material but in special cases may include air and vacuum.

The present disclosure describes a micro-electro-mechanical transducer having a surface plate that is connected to a spring layer (e.g., a membrane layer) through a connector to at least partially decouple the mass and the equivalent spring constant in the transducer. Decoupling of the mass from the equivalent spring constant provides a design freedom to potentially overcome some of the problems mentioned above. Especially, free of the constraint of the spring constant requirement, the surface plate may be optimized for the performance of the transducer.

Figure 2:
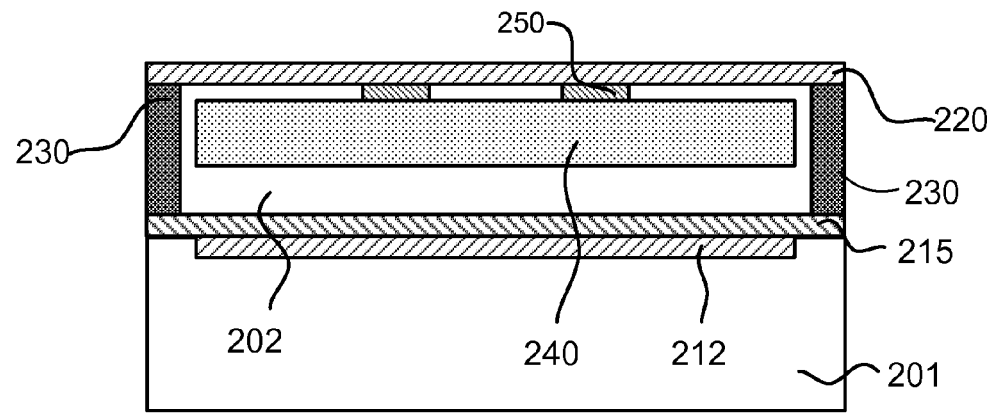
FIG. 2 shows a schematic cross-sectional view of a first embodiment of the present disclosure in a cMUT having a flexible membrane surface.

FIG. 2 shows a schematic cross-sectional view of a selected portion of a first embodiment of the present disclosure in a cMUT having a flexible membrane surface. The cMUT in FIG. 2 has in a lower portion a base including substrate 201, bottom electrode 212, and insulation layer 215. The cMUT also has a spring layer 220 which may be a flexible membrane, and a mass layer 240 connected to the spring layer 220 through a spring-mass connector 250. The spring layer 220 is connected to insulation layer 215 through spring anchors 230. The insulation layer 215 is optional, and when used may also be placed on the bottom surface of the mass layer 240. The bottom electrode 212 may be a separate layer of conductive material (such as a metal), but may also be an integral part of the substrate 201 if the substrate 201 is conductive. Preferably, the mass layer 240 may include a top electrode (not separately shown). The top electrode may either be a separate layer of a conductive material or an integral part of the mass layer 240 if the mass layer 240 is conductive. The spring layer 220 may be a part of the top electrode if it is conductive. Otherwise, the vias (not shown) are needed to access the top electrode on the mass layer 240. The vias, if needed, preferably should be formed through the spring layer 220 and the spring-mass connector 250.

The section of the cMUT shown in FIG. 2 may have a single spring-mass connector 250 or multiple similar connectors. Preferably the total area of the spring-mass connector(s) 250 should be smaller than that of the mass layer 240 such that the spring-mass connectors 240 do not cover the entire surface of the mass layer 240. This configuration allows the mass layer 240 to be attached to the spring layer 220 and moved together as a single mass in a vibration mode, yet at the same time does not result in complete mechanical coupling or integration of the mass layer 240 and the spring layer 220. This allows at least a partial decoupling between the equivalent spring constant and the equivalent spring mass and thus permits design flexibility.

The design of the present disclosure shown in FIG. 2 thus has a more independent mass, which may be primarily contributed by the mass layer 240, and an equivalent spring constant which is mainly determined by the dimension and material properties of the spring layer 220. This allows a higher degree of flexibility in choosing the materials and dimensional designs of both the spring layer 220 and the mass layer 240. For example, a relatively rigid mass layer 240 may be used without undesirably affecting the equivalent spring constant. The mass layer 240 may also serve as the top electrode. If the mass layer (top electrode) 240 is designed to be sufficiently rigid, it will likely form a parallel plate capacitor with the bottom electrode 212. A parallel plate capacitor may be designed to effectively utilize the most device area, and thus improve the device performance over the designs the prior art. In contrast, in the prior art where there is no component similar to the mass layer 240, the spring layer usually needs to be a flexible membrane because an overly rigid membrane may result in an undesirable spring constant that negatively affects the transducer performance.

Even for a prior art cMUT with a piston-shaped central portion of the membrane, the piston portion may still significantly contribute to the equivalent spring constant and the piston portion may still be deformed by the bending of the thinner portions of the membrane. The present disclosure solves the problem by placing spring-mass connectors 250 between the spring layer 220 and mass layer 240 at proper locations to at least partially decouple the mass and the spring.

Figure 3:
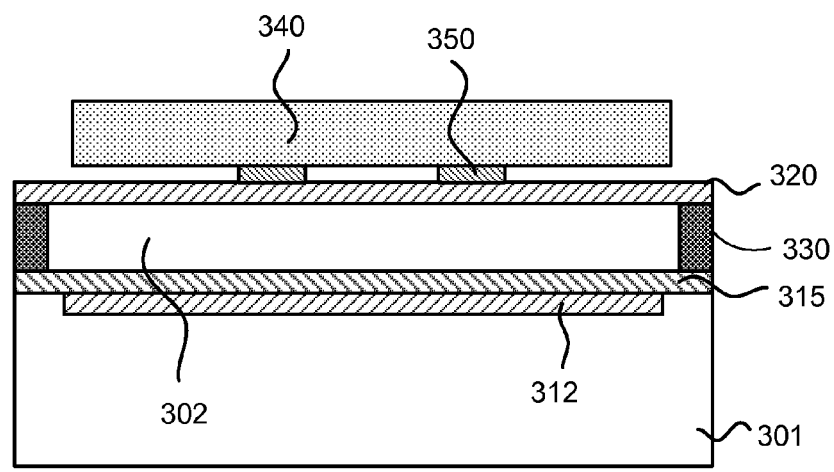
FIG. 3 shows a schematic cross-sectional view of a second embodiment of the present disclosure in a cMUT having a flexible membrane.

FIG. 3 shows a schematic cross-sectional view of a selected portion of a second embodiment of the present disclosure in a cMUT having a flexible membrane. The cMUT in FIG. 3 is similar to that shown in FIG. 2 except for the positioning of the mass layer in relation to be spring layer. As shown in FIG. 3, the cMUT has a lower portion including a base including substrate 301, bottom electrode 312, and insulation layer 315. The cMUT also has a spring layer 320 which may be a flexible membrane, and a mass layer 340 connected to the spring layer 320 through a spring-mass connector 350. Unlike that mean FIG. 2, the mass layer 340 are placed above the spring layer 320 and connected through the spring-mass connector 350 thereto.

Figure 1B:
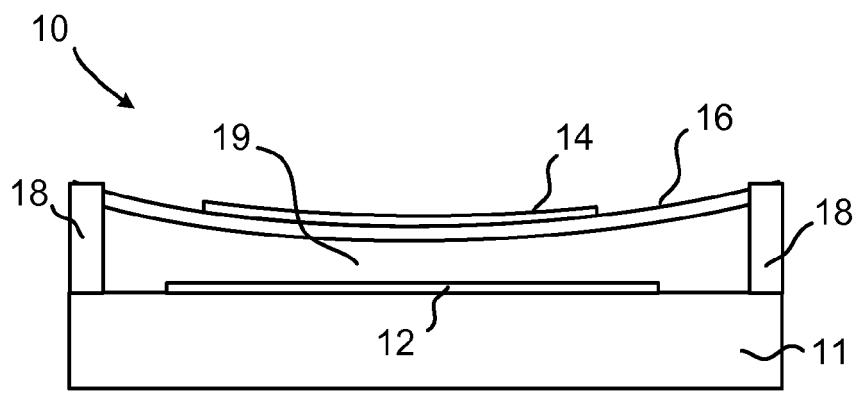
FIG. 1B shows an enlarged view of a single cMUT cell of FIG. 1A.
Figure 1C:
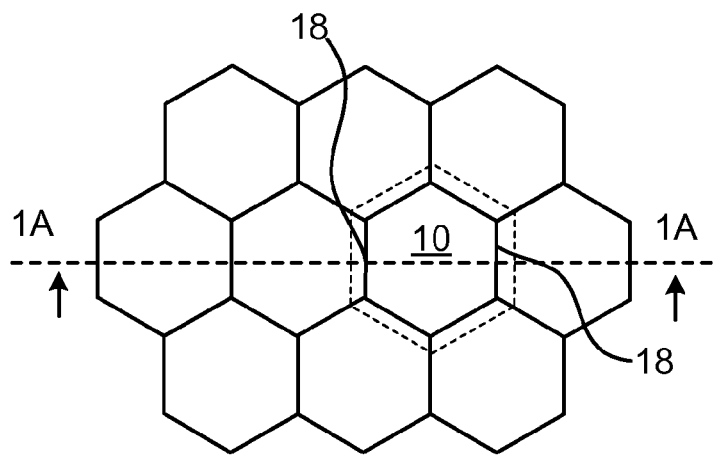
FIG. 1C shows a corresponding schematic top view of the same prior art multi-cell cMUT structure.

The cMUT structures shown in FIGS. 2-3 may be a basic unit (building block) of a complete cMUT. For example, when applied in conventional cMUTs with a flexible membrane surface, the structures shown in FIGS. 2-3 may be the structure for each cell, as shown in FIG. 1C, used to complete a CMUT element. The spring anchors 230 may be part of a continuous wall anchoring a flexible membrane (the spring layer 220) to define the periphery of a single cell of a complete cMUT.

The present disclosure may be especially benefiting when applied in cMUTs with embedded springs as disclosed in the several patent applications referenced to and incorporated herein. In particular, when embodied in cMUTs with embedded springs, the present disclosure is envisioned to do away with the cMUT cell requirement. As will be shown next, although the present disclosure may be used to fabricate cMUT elements each having multiple cells, this is not necessary. In fact, due to the inherent characteristics of the cMUT design in accordance with the present disclosure, it may be preferable from a fabrication point of view to make each addressable cMUT element without any internal cell boundaries.

In this description, a cMUT element or a micro-electromechanical element refers to a device unit that is capable of performing an energy transformation through the control of an external or built-in control circuit and is individually addressable through the external or built-in control circuit. Each addressable cMUT element defines a device element area of the substrate wafer and a corresponding device element area of the surface plate.

In addition, even when an addressable cMUT element in accordance with the present disclosure is made of multiple smaller segments (such as areas each having its own surface plate segment separated from that of others), these smaller segments do not need to have a clamped perimeter or a peripheral support wall, and further do not need to be identical to each other in size or shape.

The design in accordance with the present disclosure is potentially able to increase the effect of average displacement of transducer-medium interface without having to increase the maximum displacement of the membrane. In general, the maximum displacement of the membrane (spring layer) is prescribed or limited by the stability of the device and has little room to further increase for a given electrical gap design. Therefore with the prior art cMUT the ability to increase the average displacement by increasing the maximum displacement is very limited. By adding a surface plate anchored at a location where the maximum displacement occurs, the average surface plate displacement of the device is close to the maximum displacement that can be generated (or tolerated) on the membrane by electrostatic force. In addition, the displacement of a rigid surface plate in accordance with the present disclosure is relative uniform and there is little to none dead zone on the surface plate. Although there may still be the dead zones on the spring layer (membrane), the medium does not see the dead zones on the spring membrane which are embedded underneath the surface plate. As a result, the whole device surface, which may be the surface plate surface, is free of significant dead zones.

The surface plate in accordance with the present disclosure is akin to a mechanical amplifier for vibration (ultrasound in the case of cMUT). Since the membrane is clamped at its peripheral bands, it generally has a non-uniform displacement, usually with a maximum at the center. Therefore, the average displacement of the spring layer (the membrane displacement) of the transducer is much smaller than the maximum displacement. This is a cause of some drawbacks of the prior art cMUT without the surface plate of the present disclosure. With the present disclosure, the surface plate may be designed to be significantly more rigid than they spring layer.

In addition, since the top electrode is on the spring layer rather than on the surface plate, the electrostatic force is primarily applied on the spring layer (membrane) to bend the spring layer rather than the surface plate. As a result, there may be very little deformation experienced by the surface plate in operation. If the surface plate is connected to the spring layer at an optimal position where the maximum displacement is most likely to occur, the entire surface plate is moved at the maximum displacement. As a result, for a given amount of average displacement occurs at the spring layer, a significantly greater average displacement will be experienced at the surface plate, which interfaces with the outside medium. In general, a greater average displacement experienced by the surface plate corresponds to a higher efficiency and sensitivity of the transducer.

In general, the spring-mass connectors contribute little to the total mass. However, the location and the area sizes of the spring-mass connectors may affect the spring strength (equivalent mass constant), and thus should be carefully chosen. In some embodiments, the spring-mass connectors may preferably have an area size substantially smaller than that of the mass layer and are placed at positions to leave at least the areas of the spring layer close to the spring anchors unattached (uncoupled) to the mass layer. This design may help minimizing the effect on the spring strength (equivalent spring constant) caused by attaching a mass layer.

It is appreciated that the spring-mass connectors and the spring anchors may both either be separate components or integral with one of the layers they connect to. Because the spring anchors are placed between two electrodes forming a capacitor, they generally should be made from an electrically insulating material. The mass of mass layer is preferably optimized for an operating frequency of the transducer.

As the mass layer functions as a surface plate to interface with a medium in operation of the transducer, it preferably should have a surface area optimized for efficient interfacing with the medium. In order to have the largest possible membrane area to form springs (e.g., cantilevers anchored at the spring anchors as shown) and the area of active electrical field, the spring anchors should preferably have a minimized footprint.

Although present disclosure may be applied in regular cMUTs with a flexible membrane to enhance the performance, an even more effective utilization of the present disclosure is in cMUTs having embedded springs (ESCMUT) as disclosed in the several patent applications referenced to and incorporated herein. These applications are shown in the figures below. It is noted that although a schematic showing of a small unit of the transducer in such embodiments may look similar to FIG. 3, the actual structures, especially the configuration and distribution of the connectors and anchors, are quite different.

More importantly, in the cMUT of the present disclosure (e.g., the cMUT in FIG. 3) based on conventional cMUT having cells, the cells are mechanically isolated from each other by the spring anchors on the membrane layer and the trenches/gaps between the cell's mass layer. Therefore, the cells in such cMUT designs are independent on each other during the transducer operation. In contrast, in the ESCMUT of the present disclosure shown below, a single ESCMUT element may have multiple spring units that are mechanically connected by a common surface plate and therefore coupled to each other during the transducer operation. This may be true even in the ESCMUT made of small identical units of the transducer. This fundamental difference results in a different spring system. As a result, the cMUT of the present disclosure based on the conventional cMUT having cells and the cMUT of the present disclosure based on the ESMUT design may be two essentially different physical structures when the transducer or a transducer element is viewed as a whole. The two different structures may have significantly different frequency response and mode shapes even if they may have basic units that look alike individually in a schematic cross-sectional view. Moreover, the basic units in ESCMUT may be not identical.

Figure 4:
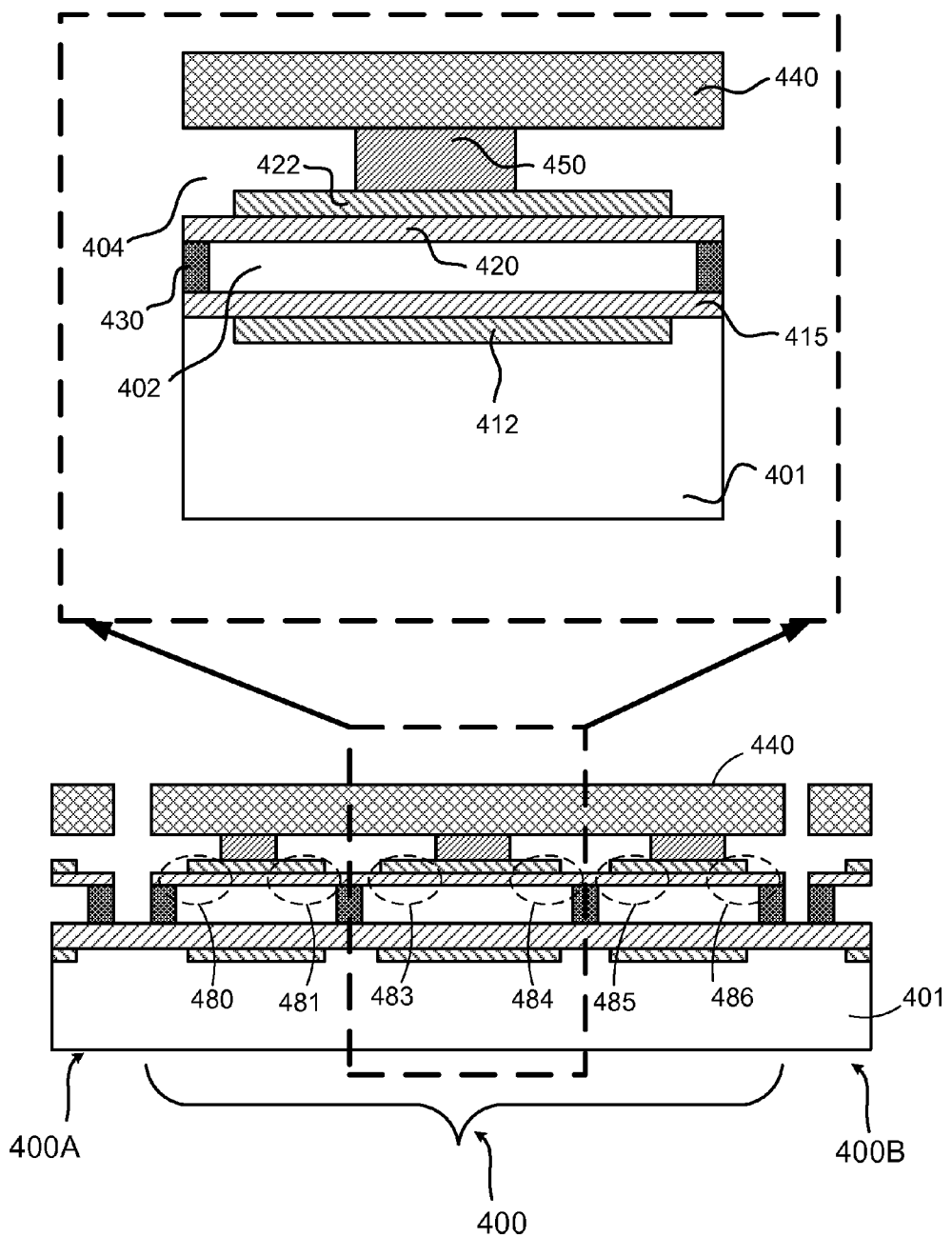
FIG. 4 is a cross-section view of a cMUT structure showing a complete cMUT element and parts of neighboring cMUT elements, one on each side.

FIG. 4 is a cross-section view of an ESMUT structure showing a complete cMUT element 400 and parts of neighboring cMUT elements 400A and 400B, one on each side. The enlarged view of a section (unit) of the cMUT structure is shown within a rectangle of dashed lines on top of the complete cMUT element.

The cMUT structure is built on a substrate wafer 401. The lower portion (base) of the cMUT includes substrate 401, bottom electrode 412 and insulation layer 415. A spring layer (a flexible membrane) 420 is connected to the insulation layer 415 through spring anchors 430. A top electrode 422 is placed on the spring layer 420 (if the spring layer 420 is made of a conductive material, a separate top electrode 422 may not be needed). A surface plate (mass layer) 440 is connected to the top electrode 422, and thus to the spring layer 420, through spring-mass connector 450. The surface plate 440 may be adapted to interface with a medium.

The location of the top electrode 422 may be at any position above the transducing gap (e.g., 402 or 502 in FIG. 5) defined between the two electrodes. Preferably, the top electrode 422 is placed on the spring layer 420 or is an integral part thereof. The bottom electrode 412 can reside on the substrate wafer 401 or be an integral part thereof. The surface plate 440 is actuated by the applied electrode field between two electrodes 412 and 422 to transmit the ultrasound into the medium, and the ultrasound can be detected if it impinges on the surface plate 440 cause the capacitance between two electrodes 412 and 422 to change.

The cMUT may be operated in two different modes. In a receiver mode, ultrasonic waves in a medium is picked up by the surface plate 440 which moves in a piston fashion to exert a force on the spring layer 420 through the spring-mass connector 440. The spring layer 420 is anchored at its two ends at spring anchors 430. When pushed by the surface plate 440 through the spring-mass connectors 450, the spring layer 420 and the top electrode 422 move relative to the bottom electrode 412, causing a change in the capacitance of the capacitor formed between the top electrode 422 and the bottom electrode 412. The capacitance change is picked up by the device circuitry as the signal. In a transmitter mode, the capacitor of the top electrode 422 and the bottom electrode 412 are driven by the device circuitry to cause a motion of the top electrode 422. The motion of the top electrode 422 moves the surface plate 440, which interfaces with the surrounding medium to transmit an ultrasound signal.

Because the surface plate 440 does not need to be a part of the capacitor, it does not need to have an electrode, and further does not need to be placed very close to the bottom electrode 412. Accordingly, there may be no electrical field between the surface plate 440 and the spring layer 420. This is advantageous in terms of performance and design freedom. For example, the gap underneath the surface plate is less critical and the material quality requirement for the surface plate may be low, making the fabrication easier. For this reason, the present disclosure provides an even greater design freedom, and potentially even better performance, than the cMUTs with embedded springs disclosed in the several patent applications referenced to and incorporated herein.

The surface plate (mass layer) 440 may preferably a contiguous plate moving as a single mechanical member for each cMUT element. Using a contiguous plate (which may have patterns such as holes and a honeycomb structure in some embodiments to enhance the rigidity/mass ratio) for each element may be benefiting for keeping a unified phase within the same cMUT element. However, since the surface plate may not be made of an ideal material that is very light yet very stiff, it may have its own resonant frequency. The resonant frequency of the surface plate is determined by the material stiffness, the plate thickness and the plate size. Depending on the cMUT operating frequency and the element size, it may not be possible to achieve a desired operating frequency using a single surface plate if the cMUT element size is very large and operation frequency is high. In this case, it may be necessary to use more than one surface plate for each element so that the device resonant frequency is not undesirably affected by the resonant frequency of the surface plate. Nevertheless, it is usually desirable to use as few surface plates for each element as possible for better performance. Furthermore, even if multiple segments of the surface plate are used for each cMUT element, each segment does not need to be identical, although there may be identical for the design and fabrication convenience.

The surface plate in accordance with the present disclosure is preferably light and rigid. In addition to selecting materials that have light and rigid properties, the surface plate may also be engineered to enhance such properties. For example, cavities or holes may be formed on or in the surface plate to significantly lower the mass of the surface plate without substantially affecting its rigidity. Examples of such engineering and designs are disclosed International Application (PCT) No. PCT/IB2006/051568, entitled MICRO-ELECTRO-MECHANICAL TRANSDUCERS, filed on May 18, 2006, which application is fully by reference incorporated herein.

The surface plate increases the equivalent mass of springs in the transducer, and this may affect the operating frequency of the transducer. In order to maintain the same frequency, the spring strength (or equivalent spring constant) may need to be increased. One way to do this is to shrink the spring membrane size of each anchored unit. At the same time, a light and stiff surface plate is preferred so that the membrane size does not need to be shrunk to a size that is too small. The final design may be a compromise balancing the competing factors. But it is noted that the primary advantages of the surface plate include increased average displacement of the transducer-medium interface, more uniform displacement profile if needed, and less dead zone on the device surface.

Overall, the frequency response (or mechanical properties) of the cMUT in accordance with the present disclosure is similar to the ESCMUT (embedded spring cMUT) disclosed in the several patent applications referenced to and incorporated herein. If the surface plate is rigid, the frequency response of the cMUT may be quite simple, perhaps even simpler than a conventional membrane cMUT. In the conventional cMUT, both the operation frequency mode and high-frequency modes are defined by the membrane. The frequency separation between two modes is therefore largely fixed. In contrast, by proper design the operating frequency of the cMUT and ESCMUT in accordance with the present disclosure may be defined by the spring membrane and surface plate, while the high-frequency modes may be defined by the surface plate only. As a result, a light and stiff surface plate may also improve the bandwidth by pushing higher the anti-resonant frequency at which the transducer has almost no ultrasound output.

Moreover, the ESCMUT in accordance with the present disclosure may use the two-capacitor configurations disclosed in the several patent applications referenced to and incorporated herein. In this particular configuration, the spring-mass connector is made of an insulation material so that the surface plate may comprise a third electrode to form a second capacitor with the electrode integrated with the spring membrane.

Figure 5:
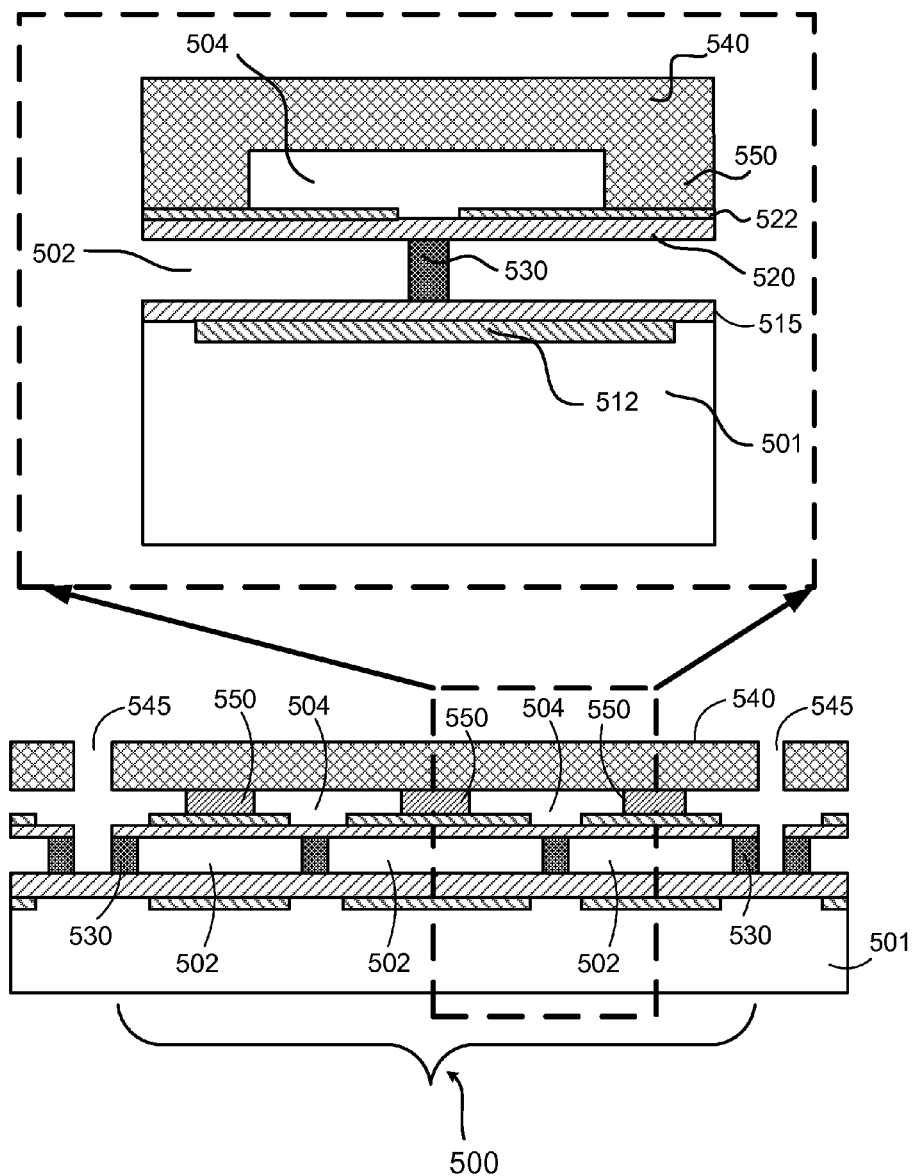
FIG. 5 is a cross-section view of a cMUT structure showing an enlarged view of a section (unit) of the cMUT structure taken from a complete cMUT element.

FIG. 5 is a cross-section view of a cMUT structure showing an enlarged view of a section (unit) of the cMUT structure taken from a complete cMUT element. The enlarged view of a section (unit) of the cMUT structure is shown within a rectangle of dashed lines on top of the complete cMUT element. This cMUT structure unit is similar to that shown in FIG. 4. Although a cMUT element may be built using either a single unit shown in FIG. 4 or a single unit shown in FIG. 5, this structure is better understood within the context of a complete cMUT element which may have a combination of multiple cMUT units like that shown in FIG. 4 and FIG. 5. For example, the cMUT unit shown in FIG. 5 may be understood to be taken from the same cMUT element 400 shown in FIG. 4 but at a shifted position.

Similar to the cMUT structure unit shown in FIG. 4, the cMUT structure in FIG. 5 is built on a substrate wafer 501. The lower portion (base) of the cMUT includes the substrate 501, bottom electrode 512 and insulation layer 515. A spring layer (a flexible membrane) 520 is connected to the insulation layer 515 through spring anchor 530. A top electrode 522 is placed on the spring layer 520 (if the spring layer 520 is made of a conductive material, a separate 522 may not be needed). A surface plate 540 is connected to the top electrode 522, and thus to the spring layer 520, through spring-mass connectors 550. The surface plate 540 may be adapted to interface with a medium.

An addressable cMUT element may have any number of spring anchors and spring-mass connectors. According to one aspect of the present disclosure, spring anchors may be distributed across the respective transducer element and not merely placed at the peripheral of the cMUT element to form in isolation wall. In some embodiments, at least one spring anchor is located away from a peripheral of the transducer element.

In general, the locations of the spring anchors and the spring-mass connectors are preferably shifted to avoid overlapping between a spring anchor and a spring-mass connector. In the embodiments shown in FIGS. 4-5, for example, the spring-mass connectors (450 and 550) are positioned in the intervals of the spring anchors (430 and 530), and vice versa. This configuration is best understood to be a profile of a spring distribution. For example, the spring anchors are each horizontally distanced from the neighboring spring-mass connectors, forming cantilevers of the spring layer. These cantilevers serving as the springs in the transducer are indicated in FIG. 4 using circles of dashed lines and denoted as 480, 481, 483, 484, 485 and 486. The flexibility of the spring layer allows the spring-mass connectors to displace vertically thus transporting the mass layer in the same direction.

As shown in the above examples, multiple cantilevers may be formed in the cantilever-forming area. The spring layer may have a plurality of spring-mass connectors connecting to the surface plate. The plurality of connectors may be distributed across the device element area to define a connector density profile indicating an average connector density per area at each location on the spring layer. Each connector and its corresponding cantilever may be considered as a spring having a certain spring strength value, which when combined with the respective average connector density at the location can define an effective spring intensity profile. For example, the effective spring intensity may be defined as spring strength per unit area at a location, which would be determined by combining the spring strength of individual cantilevers and the number of cantilevers in a unit area (spring density).

The spring anchors and their corresponding spring-mass connectors may be distributed across the substrate wafer in any pattern to achieve desired support characteristics such as device frequency responses and mode shapes. When combined with spring distribution profiles and special shapes and patterns of the surface plate, virtually unlimited possibilities are available. For example, a plurality of identical cantilevers each represented by a spring may be evenly distributed over the device element area. The resultant effective spring intensity is substantially uniform over the device element area. In another embodiment, two types of cantilevers represented by two types of springs may be used. The first type has stronger spring strength than the second type. The effective spring intensity may be arranged to be significantly higher at area locations near a perimeter of the device element area than at locations near a center of the device element area.

Many other possible cMUT designs for the surface plate and embedded springs may be made with the present disclosure. Some examples of spring distribution and the surface plate profile are disclosed in International Application (PCT) No. PCT/IB2006/051568, entitled MICRO-ELECTRO-MECHANICAL TRANSDUCERS, filed on May 18, 2006, which application is fully by reference incorporated herein.

In addition to the spring strength and spring density, both spring anchors and spring-mass connectors may have any desirable shape and size. For example, they may be discreet posts. They may also be extended walls forming various patterns on the surface of the layer they are attached to.

When used in the cMUTs with embedded spring as described in the several patent applications referenced to and incorporated herein, the resultant cMUT in accordance with the present disclosure essentially does away with the conventional concept of the cell insulation wall which divides a cMUT element into cells and is required to support and clamp the membrane at the perimeter of each cMUT cell.

The conventional cMUT designs (such as that shown in FIGS. 1A-1C), all require a cell insulation wall (e.g., cell insulation wall 18 in FIGS. 1A-1C) at the perimeter of each cMUT cell to support and clamp the perimeter of the membrane. The cell insulation wall defines the prior art cMUT cells. Within the perimeter defined by the insulation wall, the bottom electrode in the prior art cMUT structure is directly deposited on the substrate 11 (FIG. 1), which is separated from the cell insulation wall. Because the majority of the membrane within a cell (e.g., 16 in FIG. 1) is unsupported in the prior art design, the size of each cell and the selection of the materials for the membrane are limited.

In contrast, with the cMUT design as shown in FIGS. 4-5 (and other embodiments shown in figures below), the cMUT element is no longer required to be divided into cells and thus has no need of an insulation wall to define cell perimeters. The surface plate (e.g., 440 or 540) is supported by a resilient structure (multiple cantilevers in the embodiment shown) through multiple connectors that can be freely positioned and distributed based on need, thus effectively distributing the entire load of the surface plate over multiple springs (cantilevers). This solves the problem of the cell limitation inherent to the prior art designs. The spring layer (e.g., 420 or 520) and top electrode (e.g., 422 or 522) are supported by multiple spring anchors (e.g., 430 or 530) which can also be distributed across the entire substrate wafer (e.g., 401 or 501) based on need, rather than being limited to peripheral areas. There is no need for a central pedestal and a separate peripheral compliant support structure. Only spring anchors distributed across the entire device element area are used to support the spring layer and the bottom electrode. Each spring anchor serves as a support to the spring layer and the top electrode, and also as an anchor to a corresponding cantilever (or two cantilevers in the configuration shown in FIG. 5, one on each side of the spring anchor 530).

With this design, a cMUT element with a very large active area may be formed. The operating frequency of the cMUT element may be adjusted not only by selection of the materials and the configurations of the surface plate 540 but also by the configurations of the multiple cantilevers, including the spring strength of individual cantilevers and the cantilever distribution density profile across the area of the cMUT element.

In principle, a cMUT element of the present disclosure may have an active area significantly larger than what would be possible with the conventional cMUT structures. The active area of a cMUT may be defined as the total movable area. For cMUT elements of a comparable overall size (cMUT element area), the active area of the cMUT element of the present disclosure may still be much greater than the total active area of the multiple cMUT cells in a conventional cMUT element. For example, the active area of the cMUT of the present disclosure can be, if needed, close to 100% of the element (device) area, while the total active area of multiple cMUT cells in a conventional cMUT element may cover about 60-90% of the element (device) area. Usually, the higher the operation frequency is, the lower the active area percentage is for a conventional cMUT. In addition, even for a given movable area, the cMUT of the present disclosure potential yields a greater effective active area, which may be defined as the area of the effective electric field activating the capacitors.

Because the surface plate is not required to have an electrode and be a part of the capacitor, it affords more freedom of design. The surface plate of the present disclosure may potentially be an even more effective interface with the medium than that in the cMUT with embedded springs disclosed in the several patent applications referenced to and incorporated herein.

The entire surface plate formed above the substrate wafer may be movable without any clamped or fastened area. If desired, multiple cMUT elements can be formed by forming separation trenches (e.g., 545 in FIG. 5) through the surface plate (e.g., 540). In some configurations, the separation trench may also cut through the spring layer (e.g., 520). In principle, however, the entire cMUT structure with a very large active area may be used as a single cMUT element.

Furthermore, unlike the flexible membrane clamped on its edges (or posts) in the conventional cMUTs, the surface plate in the cMUT of the present disclosure can be designed to be either flexible or rigid. With a rigid surface plate, the whole surface of the cMUT, which may include any number of separate segments of surface plates, may be movable with a very uniform displacement profile.

A transducer may also comprise basic building units each having a single cantilever which is a half of either the head-to-head double cantilever shown in FIG. 4 or back-to-back double cantilever shown in FIG. 5. Although this may not be the most efficient structure in terms of fabrication process, it is nevertheless feasible to make such a transducer using the fabrication methods disclosed herein and other fabrication methods disclosed in the several patent applications referenced to and incorporated herein.

In the exemplary cMUT structures shown in FIGS. 4-5 (and some other figures below), both the spring anchors and the spring-mass connectors appear as separate components attached to the layer components. However, the spring anchors and the spring-mass connectors may be an integral part of a layer component to which they are attached. It is appreciated that other configurations may be used to create the cavities (402 and 404 in FIGS. 4 and 502 or 504 in FIG. 5), the spring-mass connectors and the spring anchors. For example, the spring anchors may be an integral part of the substrate in the base. A part or the whole spring anchor may either be a separate layer introduced between the spring layer and the substrate, or an integral part of the spring layer.

The exemplary spring layer as shown in FIGS. 4-5 is a continuous layer placed over the top of the multiple spring anchors and a multiple cavities (402 or 502). The exemplary spring layer thus occupies the entire device element area longitudinally (i.e., in the lateral or surface dimension) in the embodiment shown. This configuration allows the entire surface plate to be supported by cantilevers through spring-mass connectors that can be placed or distributed all over the entire device element area without being limited to places near the edge of the element. It is appreciated, however, that the spring layer may comprise multiple small segments that are either connected to each other at certain points or completely separated from each other. Such a configuration may allow further flexibility of using different materials and different thicknesses of the spring layer at different locations, but may complicate the fabrication process.

Even if multiple surface plates are used for a single transducer element, these surface plates do not need to be clamped at some cell boundaries like the membranes for each cell in the prior art. The multiple surface plates further do not need to be identical to each other. Generally, even with multiple surface plates, only a small number of the surface plates would be necessary for each addressable device element, much fewer than the number of individually clamped cells that would have been required in conventional cMUT designs.

Within the general principle of the present disclosure, there is great room of design freedom in terms of the overall size of each addressable device element, the size, shape and arrangement of the cavities, the size, shape and arrangement of the anchors for cantilevers, the size, shape and arrangement of the connectors, and the thickness, shape, segment (separation) pattern and material selection of each layers (the substrate wafer, the spring layer and the surface plate). The cantilevers formed from the spring middle layer function as embedded springs that can be of a variety of spring strength, size and density variations. These embedded springs may be made of a single contiguous flexible membrane as the spring layer or multiple flexible membranes of identical or different size and shape as segments of the spring layer. The locations of the spring-mass connectors (e.g., 430 are 530) may be designed to obtain the optimal displacement for the surface plate or the desired frequency response for the cMUT during the cMUT operation. The configuration of the surface plate, such as using smaller surface plate segments, may also be adjusted to achieve desired frequency response for a cMUT element with a relative large size.

As described in the several patent application referenced to and incorporated herein, wide varieties of formations are available within the spirit of the present disclosure.

FIGS. 6-9 show several exemplary designs of the spring (cantilever) distribution in accordance with the present disclosure. Each of these figures shows a schematic view of the surface pattern of the cavities, anchors and connectors between the surface plate and the base (including the substrate and the bottom electrode). For clarity, the surface plate and the base (including the substrate the bottom electrode) are not shown. The figures are views from the bottom side where the base (including the substrate) as if the base were removed.

Figure 6:
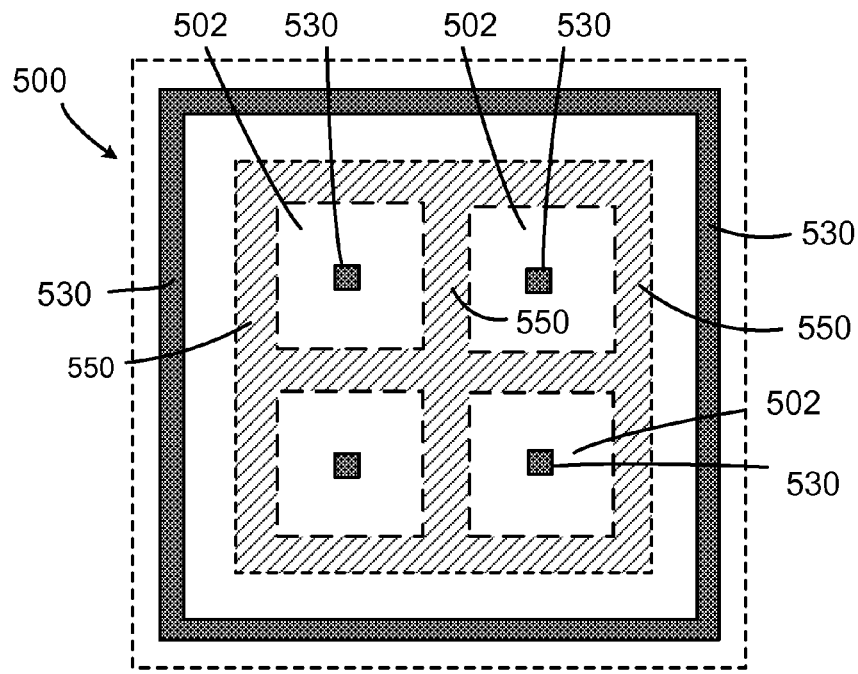
FIGS. 6-9 show several exemplary designs of the spring (cantilever) distribution in accordance with the present disclosure.

FIG. 6 corresponds to the cMUT structure shown in FIG. 5. The addressable cMUT element 500 has an overall square shape, and includes:

(1) a peripheral portion of the spring anchor 530, which is an extended wall forming an encircled square defining the outer rim of the cMUT element 500;

(2) four discrete posts as spring anchors 530 in the middle of the cMUT element 500;

(3) a mesh-shaped spring-mass connector 550 placed over the intervals between the spring anchors. Although appear as three separate spring-mass connectors 550 in FIG. 5, as shown in FIG. 6 they really are different portions of the same continuous mesh-shaped spring-mass connector 550 which may support a single surface plate 540 (not shown in FIG. 6).

Although the spring layer 520 (not shown in FIG. 6) is thin in its vertical dimension, it may be of any desired span or size on its surface (longitudinal or lateral dimension) up to covering the entire device element area. Preferably, the spring layer 520 is contiguous over large areas to make plane cantilevers instead of separate narrow strip cantilevers. In the example shown in FIG. 6, because the peripheral part of the spring anchor 530 is a contiguous closed wall forming a square (or any other shape), a plane cantilever may be formed over the peripheral spring anchor 530 and before central discrete spring anchors 530. However, it is appreciated that the spring anchors 530 (and any other spring anchors illustrated herein) may be of any pattern, including separate segments. It is appreciated that the shapes and relative sizes of the cavities 502 and 504, spring anchors 530 and spring-mass connectors 550 can be varied rather freely without departing from the general concept of the present disclosure. In particular, the term "circular" used in this description refers to a formation that has a substantially close-ended configuration, and does not suggest in any way the item or formation preferred to is round-shaped or in any other particular shape.

Figure 7:
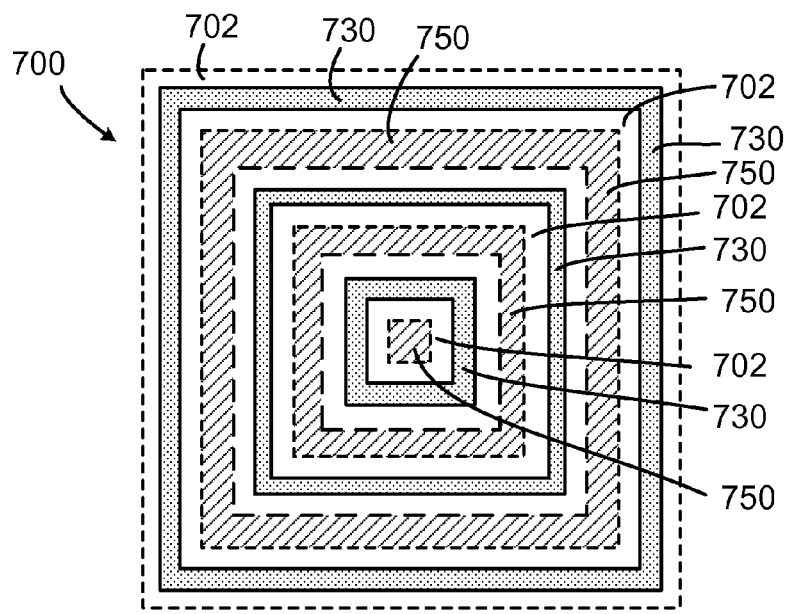

FIG. 7 shows a schematic of the surface pattern of the cavities, anchors and connectors between the surface plate and the base in a second example of an addressable cMUT element in accordance with the present disclosure. The addressable cMUT element 700 has an overall square shape, and includes:

(1) a plurality of circular spring anchors 730 of decreasing sizes each containing the cavities of smaller sizes (if there is any); and (2) a plurality of circular spring-mass connectors 750 positioned in the intervals of spring anchors 730.

With these cavities, connectors and anchors, various formations of cantilevers are possible, in similar ways discussed above.

Figure 8:
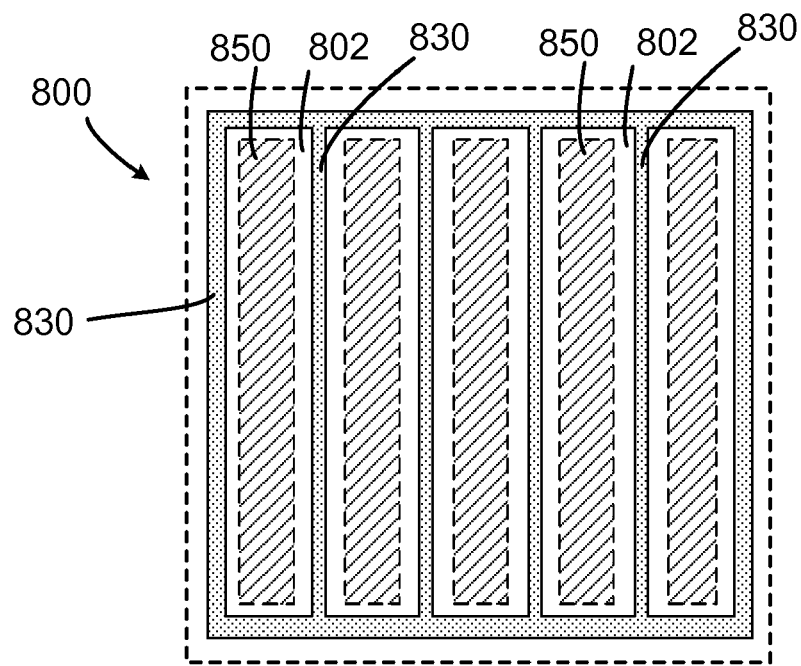

FIG. 8 shows a schematic of the surface pattern of the cavities, anchors and connectors between the surface plate and the base in a third example of an addressable cMUT element in accordance with the present disclosure. The addressable cMUT element 800 has an overall square shape, and includes:

(1) an outer circular spring connector 830;

(2) a plurality of extended straight spring anchors 830 substantially parallel to each other; and (4) a plurality of extended straight spring-mass connectors 550 parallel to each other placed in the intervals of spring anchors 830 and alternating with the straight spring anchors 830 therebetween.

Figure 9:
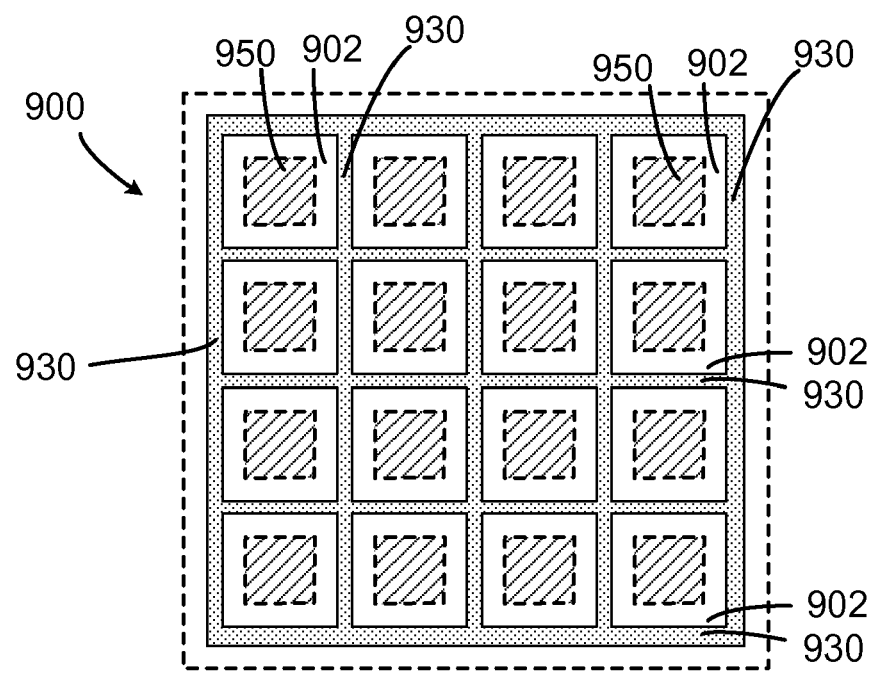

FIG. 9 shows a schematic of the surface pattern of the cavities, anchors and connectors between the surface plate and the base in a fourth example of an addressable cMUT element in accordance with the present disclosure. The addressable cMUT element 900 has an overall square shape, and includes:

(1) a pattern of spring anchors 930 having a mesh-like formation, including an outer circular spring anchor and two inter-crossing plurality of extended straight spring anchors.

(2) a plurality of discrete spring-mass connectors placed 950 over the intervals (windows) in the mesh-like formation of spring anchors 930.

It should be noted that although the exemplary formations in FIGS. 6-9 all have an outer circular spring anchor defining the boundary or perimeter of the addressable cMUT element, such an outer circular spring anchor is not required. A circular spring anchor at an outer peripheral of the cMUT element may be used to seal the cMUT element during fabrication. Sealing may be necessary for applications in a liquid medium but may not be necessary for applications in air or vacuum. However, sealing may be accomplished using a different method.

As shown in the above examples, wide varieties of formations are available within the spirit of the present disclosure. Various standing features such as posts, walls, or islands may be formed on the substrate wafer. Although in principle not all standing features must serve as a spring anchor to form a cantilever, it is preferred that as many as standing features are effectively utilized as spring anchors to optimize the performance and design freedom. In addition, in order to reduce dead zones, the spring anchors preferably should have minimized footprints.

Taking advantage of the design flexibility in the present disclosure, the transducer can be made to have a desired frequency response and optimal transmission and reception performances. In addition to the variations of cantilever distribution profiles and the material selection, mass and thickness profiles of the surface plate as shown above, other features or variations of embodiments may be incorporated into the micro-electro-mechanical transducer in accordance with the present disclosure.

Figure 10:
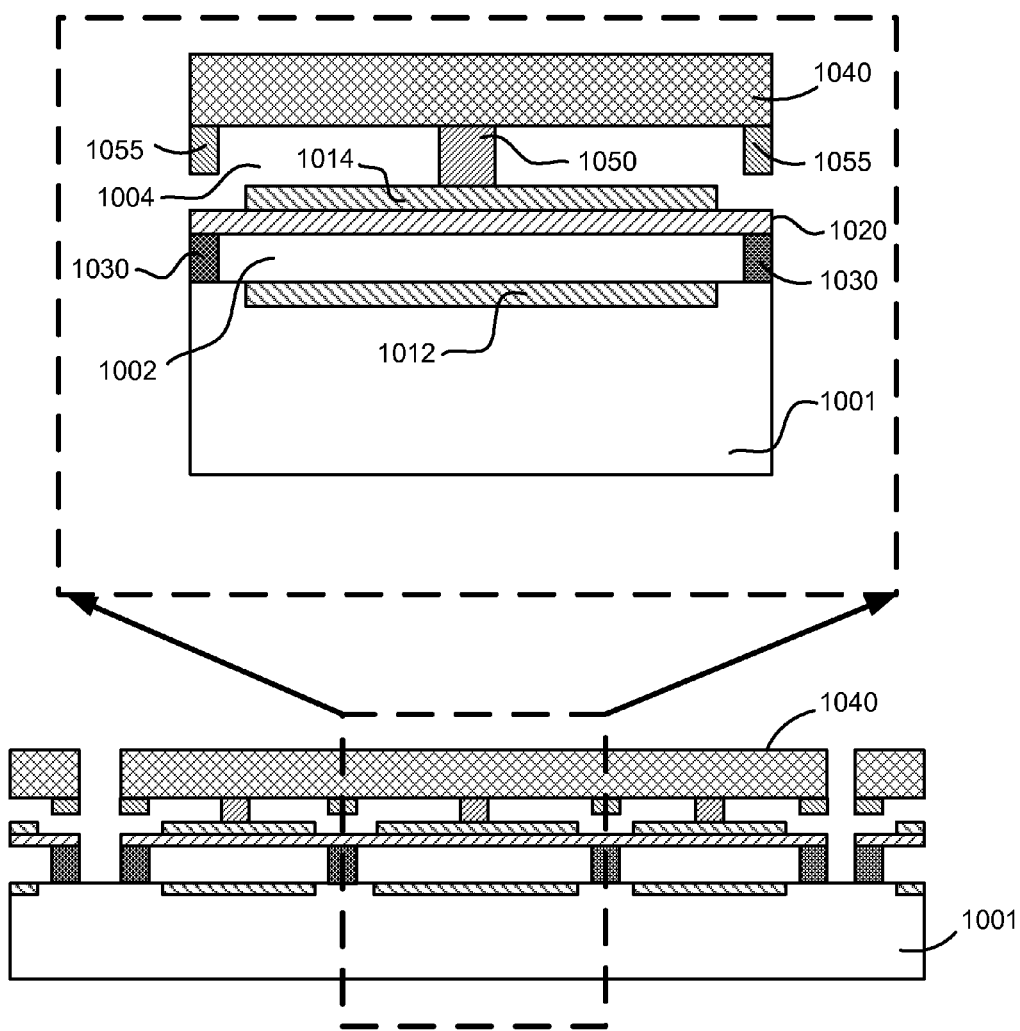
FIG. 10 is a cross-section view of another exemplary cMUT structure showing an enlarged view of a section (unit) of the cMUT structure taken from a complete cMUT element.

FIG. 10 is a cross-section view of another exemplary cMUT structure showing an enlarged view of a section (unit) of the cMUT structure taken from a complete cMUT element. The enlarged view of a section (unit) of the cMUT structure is shown within a rectangle of dashed lines on top of the complete cMUT element. Similar to the cMUT structure units shown in FIGS. 4-5, the cMUT structure in FIG. 10 is built on a substrate wafer 1001. The lower portion (base) of the cMUT includes the substrate 1001, bottom electrode 1012. A spring layer (a flexible membrane) 1020 is connected to the bottom electrode 1012 and the substrate 1001 through spring anchor 1030, which preferably is made of an insulating material. A surface plate 1040 is connected to the spring layer 1020 through spring-mass connectors 1050. The surface plate 1040 may be adapted to interface with a medium. As in the other designs described herein, the separate conductive layer for the top electrode 1014 may be optional if the spring layer 1020 is made of a conductive material. In some embodiments, however, a non-conductive spring layer may be preferred for reducing the parasitic capacitance and increasing the breakdown voltage of the transducer.

The cMUT structure in FIG. 10 further has motion stoppers 1055 disposed in the cavity 1004 defined between the surface plate 1040 and the spring layer 1020. The motion stoppers 1055 in the particular embodiment of shown are connected to the surface plate 1040, but they may also be placed on the spring layer 1020 for the same or similar effect. The motion stoppers 1055 limits the maximum vertical displacement of the surface plate 1040, which in turn limits the maximum vertical displacement of the spring layer 1020 and the spring-mass connector 1050. In this embodiment, the maximum vertical displacement of the spring layer 1020 and the spring-mass connector 1050 may be designed to be no greater than (preferably smaller than) than the transducing gap 1002 defined between the spring layer 1020 and the base (the substrate 1001 in the example shown in FIG. 10). This would effectively prevent the spring layer 1020 from touching the bottom electrode 1012 to cause a short, thus eliminating the need for an insulation layer between the two electrodes 1012 and 1014. The motion stoppers 1055 can be placed at different locations with a desired height.

Alternatively, the motion stopping function can be implemented by having a minimum height of the cavity 1004 defined by the smallest separation between the mass layer 1040 and spring layer 1020 (or any other intervening layer therebetween). If the minimum height of the cavity 1004 is smaller than the maximum possible displacement of the spring-mass connector 1050, the mass layer 1040 and the spring layer 1020 (or any other intervening layer therebetween) will contact each other before the spring layer 1020 (which carries the top electrode 1014) contacts the bottom electrode 1012. As a result, such a minimum height of the cavity 1004 may act effectively as a motion stopper to limit the vertical displacement of the spring-mass connector 1050.

Figure 11:
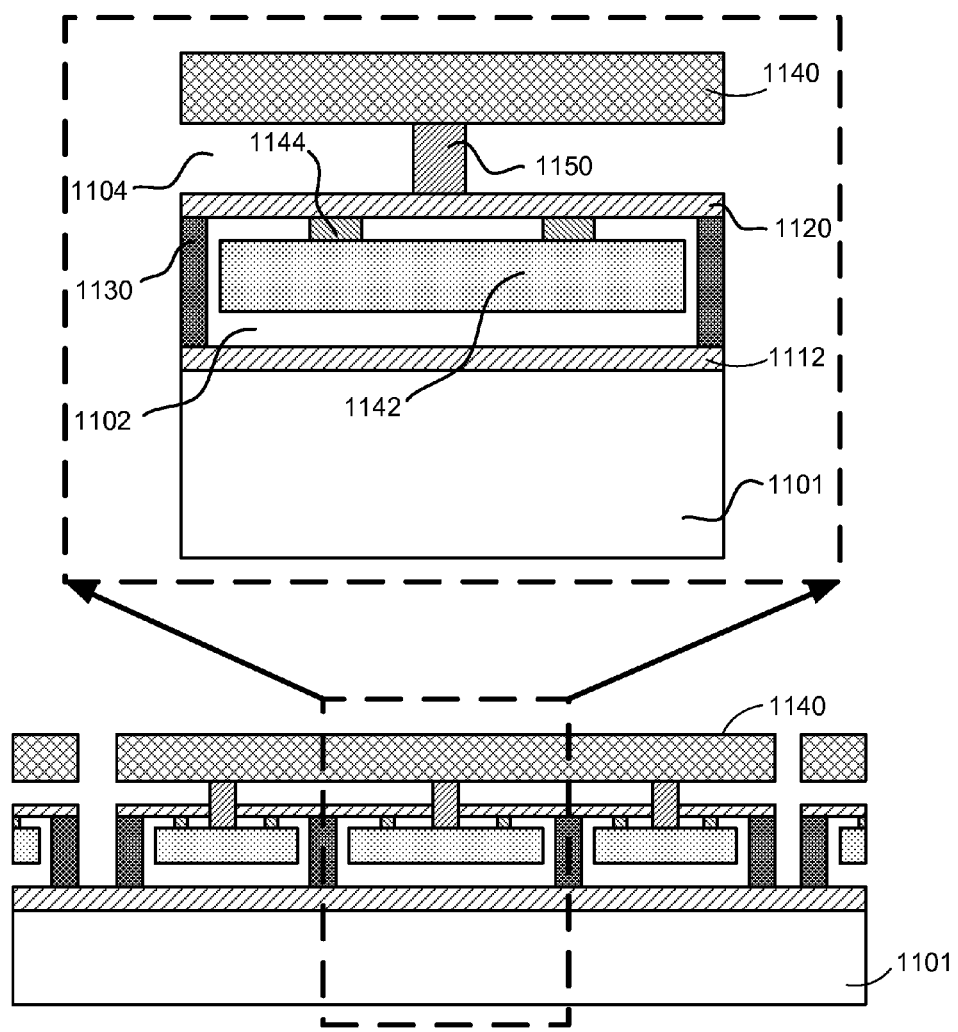
FIG. 11 is a cross-section view of another exemplary cMUT structure showing an enlarged view of a section (unit) of the cMUT structure taken from a complete cMUT element.

FIG. 11 is a cross-section view of another exemplary cMUT structure showing an enlarged view of a section (unit) of the cMUT structure taken from a complete cMUT element. The enlarged view of a section (unit) of the cMUT structure is shown within a rectangle of dashed lines on top of the complete cMUT element. Similar to the cMUT structure units shown in FIGS. 4-5, the cMUT structure in FIG. 11 is built on a substrate wafer 1101. The lower portion (base) of the cMUT includes the substrate 1101, bottom electrode 1112. A spring layer (a flexible membrane) 1120 is connected to the bottom electrode 1112 and the substrate 1101 through spring anchor 1130. A surface plate 1140 is connected to the spring layer 1120 through spring-mass connectors 1150. The surface plate 1140 may be adapted to interface with a medium.

The cMUT structure in FIG. 11 further has an optimizing layer 1142 below the spring layer 1120. The optimizing layer 1142 may be a conductive layer to serve as the top electrode. The optimizing layer 1142 is preferably a relatively rigid plate connected thereto through connectors 1144 in a manner similar to how the surface plate 1140 is connected to the spring layer. The optimizing layer 1142 optimizes the capacitor structure. Because the optimizing layer 1142 may be relatively more rigid than the spring layer 1120 and thus less prone to bending, a more uniform transducing gap is defined between the top electrode (a conductive optimizing layer 1142 in this embodiment) and the bottom electrode 1112. Furthermore, the use of connectors 1144 also partially decouples the optimizing layer 1142 from the spring layer 1120 such that it does not significantly affect the equivalent spring constant. An insulation layer (not shown) may be placed on either the top electrode (the conductive optimizing layer 1142) or the bottom electrode 1142. Alternatively, the motion stopper similar to that shown in FIG. 10 may be introduced between the surface plate 1140 and the spring layer 1120 to limit the maximum displacement of the spring layer 1120 and the optimizing layer 1142.

Figure 12:
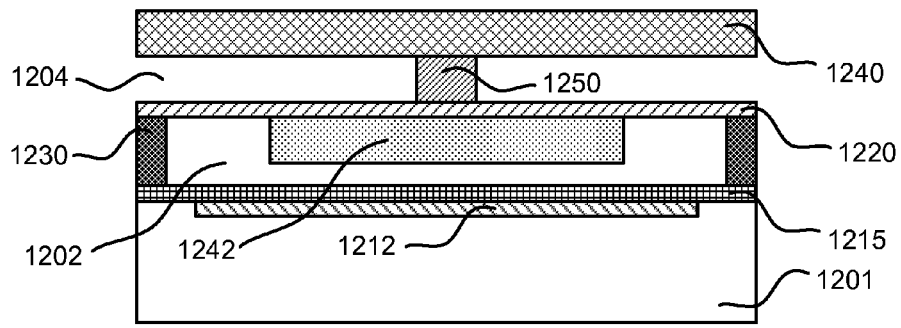
FIG. 12 is a cross-section view of another exemplary cMUT structure showing an enlarged view of a section (unit) of the cMUT structure taken from a complete cMUT element.

FIG. 12 is a cross-section view of another exemplary cMUT structure showing an enlarged view of a section (unit) of the cMUT structure taken from a complete cMUT element. The cMUT structure in FIG. 12 is built on a substrate wafer 1201. The lower portion (base) of the cMUT includes the substrate 1201, bottom electrode 1212 and insulation layer 1215. A spring layer (a flexible membrane) 1220 is connected to the insulation layer 1215 and the substrate 1201 through spring anchors 1230. A surface plate 1240 is connected to the spring layer 1220 through spring-mass connectors 1250.

The cMUT structure in FIG. 12 further has an optimizing layer 1242 below the spring layer 1220. The optimizing layer 1242 may be a conductive layer to serve as the top electrode. The optimizing layer 1242 is preferably a rigid plate. In the embodiment shown in FIG. 12, the optimizing layer 1242 is directly attached to the spring layer (alternatively, the optimizing layer 1242 may be an integral with the spring layer 1220. The optimizing layer 1242 optimizes the capacitor structure. Because it is less prone to bending, a more uniform transducing gap is defined between the top electrode (a conductive optimizing layer 1242 in this embodiment) and the bottom electrode 1212. In order that the optimizing layer 1242 does not significantly affect the equivalent spring constant of the spring layer 1220, the optimizing layer 1242 should preferably have a smaller area size such that it does not cover the end portions of the spring layer 1220 that are anchored on the spring anchors 1230 two form cantilever springs. An insulation layer 1115 may be placed on either the top electrode (the conductive optimizing layer 1242) or the bottom electrode 1212. Alternatively, the motion stopper similar to that shown in FIG. 10 may be introduced between the surface plate 1240 and the spring layer 1220 to limit the maximum displacement of the spring layer 1220 and the optimizing layer 1242.

Figure 13:
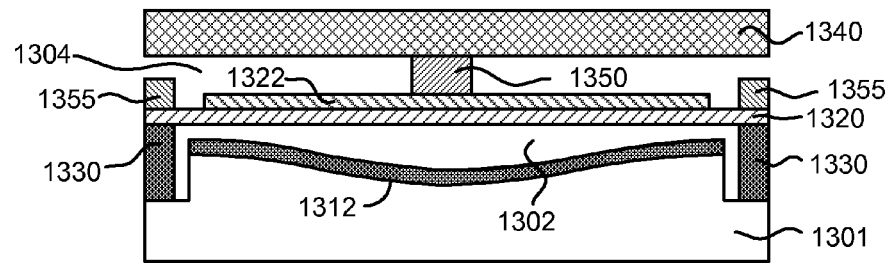
FIG. 13 is a cross-section view of another exemplary cMUT structure showing an enlarged view of a section (unit) of the cMUT structure taken from a complete cMUT element.

FIG. 13 is a cross-section view of another exemplary cMUT structure showing an enlarged view of a section (unit) of the cMUT structure taken from a complete cMUT element. The cMUT structure in FIG. 13 is built on a substrate wafer 1301. The lower portion (base) of the cMUT includes the substrate 1301 and bottom electrode 1312. A surface plate 1340 is connected to the spring layer 1320 (a flexible membrane) through spring-mass connectors 1350. Similar to the cMUT structure in FIG. 10, the cMUT structure in FIG. 13 further has motion stoppers 1355 disposed in the cavity 1304 defined between the surface plate 1340 and the spring layer 1320. The motion stoppers 1355 in the particular embodiment of shown are connected to the spring layer 1320, but they may also be placed on the surface plate 1340 for the same or similar effect. The motion stoppers 1355 limits the maximum vertical displacement of the surface plate 1340, which in turn limits the maximum vertical displacement of the spring layer 1320 and the spring-mass connector 1350, and would have an effect of preventing the spring layer 1320 from touching the bottom electrode 1312 to cause shorting, thus eliminating the need for an insulation layer between the two electrodes 1312 and 1322/1320.

Furthermore, the spring layer 1320 is connected to the substrate 1301 through spring anchors 1330 which extends below the bottom electrode 1312 and further into the substrate 1301. When the spring anchors 1330 are made of an insulating material, this design provides an insulation extension beyond the top electrode and into the substrate. This is particularly benefiting when the substrate 1301 itself is made of a conductive material, which often is the case when a silicon substrate is selected using the fabrication methods in accordance with the present disclosure. In cMUT structures that have two electrodes placed very close to each other, inadequate insulation is often an issue due to the very small separation between the two electrodes. This may be the case even if the two electrodes do not make direct contact with each other to cause shorting, and further if the supports or anchors between the two electrodes are insulators. In prior art designs, a compromising approach is often taken by choosing a larger separation gap between the two electrodes in order to obtain adequate insulation.

The insulation extension show in FIG. 13 has a potential to solve the above described problem. More examples of insulation extension are disclosed in International Application (PCT) No. PCT/IB2006/051948, entitled MICRO-ELECTRO-MECHANICAL TRANSDUCER HAVING AN INSULATION EXTENSION, filed on Jun. 16, 2006, which patent application is incorporated by reference herein.

Furthermore, the top surface of the base (including the substrate 1301 and the bottom electrode 1312) in FIG. 13 is non-flat. The top surface of the base is curved and is generally lower in the middle and higher at two ends (shoulders). This design addresses the consideration that spring layer 1320 is likely to be bent downward with the maximum bending near the center (where the spring-mass connector 1350 is located) due to a bias voltage applied and/or a dynamic deformation. The non-flat shape of the base (the substrate 1301 and the bottom electrode 1312) may help to at least partially compensate such deformation and improve uniformity of the actual separation gap of the two electrodes 1312 and 1322 in operation. More examples of such non-flat electrodes are disclosed in International Application (PCT) PCT/IB2006/052657, entitled MICRO-ELECTRO-MECHANICAL TRANSDUCER HAVING AN OPTIMIZED NON-FLAT SURFACE, filed on Aug. 3, 2006.

Figure 14:
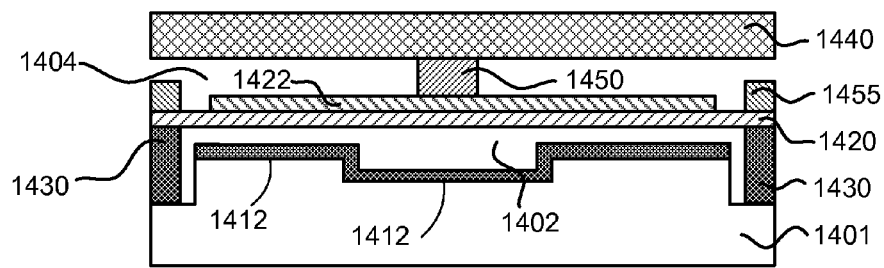
FIG. 14 is a cross-section view of another exemplary cMUT structure showing an enlarged view of a section (unit) of the cMUT structure taken from a complete cMUT element.

FIG. 14 is a cross-section view of another exemplary cMUT structure showing an enlarged view of a section (unit) of the cMUT structure taken from a complete cMUT element. The cMUT structure in FIG. 14 is built on a substrate wafer 1401. The lower portion (base) of the cMUT includes the substrate 1401 and bottom electrode 1412. A surface plate 1440 is connected to the spring layer 1420 (a flexible membrane) through spring-mass connectors 1450. Similar to the cMUT structure in FIG. 13, the cMUT structure in FIG. 14 further has motion stoppers 1455 disposed in the cavity 1404 defined between the surface plate 1440 and the spring layer 1420. Also similar to the cMUT instructor in FIG. 13, the spring layer 1420 is connected to the substrate 1401 through spring anchors 1430 which extends below the bottom electrode 1412 and further into the substrate 1401.

Furthermore, the top surface of the base (including the substrate 1401 and the bottom electrode 1412) in FIG. 14 is non-flat. The exact shape of a top surface of the base is different from that in FIG. 13. Instead of having a continuous and smoothly curved surface, the top surface of the base in FIG. 14 is stepped with a lower level in the middle and a higher level at two ends (shoulders). This design also addresses the consideration that spring layer 1420 is likely to be bent downward with the maximum bending near the center due to a bias voltage applied and/or a dynamic deformation. The simple two-step surface of the base (the top electrode 1412 and the substrate 1401) may lack the refinement of some other designs, but it may have an advantage of simpler fabrication. This may particularly benefiting when the dimensions of cMUT capacitor (particularly the width of the electoral separation) is very small. The multiple-step surface of base layer (the top electrode 1412 and the substrate 1401) may be used to replace the two-step surface shown in FIG. 14 to further improve the transducer performance. More examples of such non-flat electrodes are disclosed in International Application (PCT) PCT/IB2006/052657, entitled MICRO-ELECTRO-MECHANICAL TRANSDUCER HAVING AN OPTIMIZED NON-FLAT SURFACE, filed on Aug. 3, 2006.

Fabrication Methods in General

There are many possible combinations of material properties and size, shape and locations of the components in the micro-electro-mechanical transducer in accordance with the present disclosure. Electrically, any combination of the material and complement selections desirably should prevent the electrical shorting between two cMUT electrodes. The combination desirably should also enhance the electrical field between the two electrodes for a given input voltage and reduce the parasitic capacitance of the cMUT. It is also important to select materials with better reliability. For example, the mechanical reliability of the spring layer is important since this layer bears the maximum mechanical stress of the device. For this consideration, single crystal silicon is a good selection. In addition, the conductivity of the spring layer may be designed to be very low to reduce the parasitic capacitance. Therefore, a dielectric material (e.g., silicon nitride) is suitable. If single crystal silicon is selected as the material for the spring layer, low-doping level or intrinsic silicon may be used as a starting material for the spring layer, which may be subsequently selectively and highly doped in areas designed to be the bottom electrode.

One highly effective method for forming or introducing a surface plate (mass layer) in a cMUT structure of the present disclosure is to use wafer-bonding technology in which a prime silicon wafer or an SOI wafer having a desired silicon layer on an insulation layer is bonded to the substrate and the spring layer. In this case, the resultant surface plate would include a silicon layer or polysilicon layer, which is relatively conductive for the purpose of the applications envisioned in the present disclosure. However, because the surface plate is not required to be a part of the capacitor in the transducer, there is no need for insulation between the surface plate and the spring layer.

Ideally, the surface plate (mass layer) should be light and rigid. A ratio of 1st resonant frequency over the total mass, defined as a rigidity/mass ratio, of the surface plate may be used to evaluate the material selection and structure design of the surface plate. A higher value of the rigidity/mass ratio is generally preferred for the surface plate. Several different designs considerations are described below.

(1) If the surface plate is made of a solid plate of a single material, the selected material itself should have a low mass density and high Young's modulus (e.g., diamond is one of the best materials for such a purpose).

(2) If a certain material is already selected for the surface plate, some structure designs may be used to further improve the rigidity/mass ratio. For example, making a material porous usually increases the rigidity/mass ratio defined above. Porous silicon can be formed by electrochemical etching of silicon in an HF rich electrolyte. For another example, the surface plate can be micromachined to have a well-designed hollow structure to achieve a larger ratio of 1st resonant frequency over the total mass. The micromachining may be done by etching with a desired mask pattern.

(3) For a given material, certain treatments can be introduced to increase the equivalent Young's modulus of the materials without increasing the mass. One possible way to do this is to introduce a tension stress in the materials. For example, the stress can be introduced in a thin film formation by controlling the process parameters; the stress can also be introduced into silicon by proper doping if the silicon is used.

The above considerations and methods may be also applied to the materials of the spring layer.

Both the surface plate and the spring layer may be micromachined structures such as a porous structure to achieve modified mechanical properties. For example, the surface plate may be made of plates with holes built therein. Alternatively, the holes may be half-through cavities formed on top of the surface plate without penetrating the entire thickness thereof. Hollow structures such as voids may also be formed within the surface plate with no openings or only very small openings on the surface of the surface plate.

In general, it is preferred that the surface plate is significantly more rigid than the spring layer and is substantially unbent when transported by the vertical displacement of the connector(s). For example, if the same or similar materials are used for both the surface plate and the spring layer, the surface plate may desirably be at least three times as thick as the spring layer, and more preferably at least five times as thick. Holed or hallowed structures may be applied to the surface plate to optimize the properties such as the rigidity/mass ratio of the surface plate. Examples of such holed or hallowed structures are disclosed in International Application (PCT) No. PCT/IB2006/051568, entitled MICRO-ELECTRO-MECHANICAL TRANSDUCERS, filed on May 18, 2006;

In a capacitance micromachined ultrasonic transducer (cMUT) in accordance with the present disclosure, the bottom electrode may usually be on the substrate wafer. It is noted that in the present description, the term "on" does not necessarily suggest that a separate material or layer is placed on another layer. For example, the bottom electrode may be an integral part of the substrate wafer if the substrate has a conductive material to effectuate the bottom electrode.

In one embodiment of the present disclosure, multiple addressable device elements are fabricated on the same substrate wafer. If the substrate wafer is a conductive wafer, the multiple addressable device elements may be insulated from each other by an embedded insulator formed on the substrate wafer. Insulators and the methods of fabricating the same as disclosed in the several patent applications identified herein filed by the common applicant on even date may be useful this purpose. For example, the embedded insulator may have an insulation cavity having a desired overall thickness and being filled with a dielectric material. The embedded insulator may alternatively have a patterned cavity containing solid lines of oxidized native material of the substrate wafer. Similar embedded insulators may be formed on the surface plate.

The micro-electro-mechanical transducer of the present disclosure may use various addressing schemes to address the addressable device elements described herein. In particular, the addressable device elements may be addressed from back side of the substrate wafer via a through-wafer interconnect formed through the substrate wafer, as disclosed in the several patent applications identified herein filed by the common applicant on even date. For example, a conductive substrate wafer may be used, and the through-wafer interconnect having an annular trench surrounding a through-wafer conductor made of a native material of the conductive wafer may be used for interconnecting the multiple transducer elements. The through-wafer interconnect may further comprise a dielectric material filled into the annular trench to insulate the through-wafer conductor from rest of the substrate wafer. In one embodiment, the through-wafer conductor is positioned directly underneath the addressable device element.

The basic structure of the micro-electro-mechanical transducer described herein may be integrated with integrated circuits (IC). Metallization may be used to form the top electrode of the cMUT and to connect nearby cMUT elements with ICs.

Since the surface plate can be made of single crystal silicon with desired properties (e.g. orientation, doping level and type and the thickness, etc), integrated circuits (IC) can be fabricated directly on the surface plate to accomplish the integration. The ICs may be fabricated right after the formation or placement of the tops of the surface plate.

Alternatively, a wafer with desired ICs preformed can be introduced and bonded with the cMUT wafer during the transducer fabrication to achieve integration. The process after introducing the ICs wafer should be carefully selected to avoid of damaging ICs during the rest process steps.

The micro-electro-mechanical device such as the cMUT of the present disclosure may need to interconnect to the outside through bonding wires or the probes. To do this, electrical interface pads (e.g., wire-bonding pads or probing pads) may be needed. The interface pads usually would introduce some undesired parasitic parameters (e.g., parasitic capacitance, or inductance). In order to improve the transducer performance, the parasitic parameters may need to be minimized.

In addition to any available methods for reduction of parasitic capacitance, the novel methods to reduce parasitic capacitance of an interconnection pad by increasing the thickness of an insulator underneath the interconnection pad disclosed in the several patent applications identified herein may also be used. The method allows the thickness of insulation layer on the substrate to be defined by the etching depth instead of the thickness of a film deposition, thus making possible to fabricate insulators of a thickness significantly greater than what would be possible with film deposition techniques.

Exemplary Fabrication Methods

The micro-electro-mechanical transducer of the present disclosure may be fabricated using the fabrication methods described in the several patent applications identified herein filed by the common applicant on even date. In addition, the micro-electro-mechanical transducer of the present disclosure may be fabricated using any of the exemplary methods described below.

FIGS. 15.1-15.8 show a first exemplary fabrication process for making a micro-electro-mechanical transducer in accordance with the present disclosure. The steps of the process are described below.

In step one (FIG. 15.1), an SOI wafer 1549 including a desired mass layer (mass layer) 1540 is provided. An oxide layer 1550 is grown and patterned to be the spring-mass connectors. Another oxide layer 1541 is grown as the etching stop for the mass layer action. If the mass layer 1540 is conductive, it may be used as the top electrode in the final transducer.

In step two (FIG. 15.2), the resultant wafer from the step one is bonded to another SOI wafer 1529 including a desired spring layer 1520 (membrane layer). At the same time, the handle wafer and the box layer of the first SOI wafer 1549 are removed to expose the mass layer.

In step three (FIG. 15.3), an oxide layer 1545 is grown and patterned on the mass layer 1540 to define the transducing gap (the gap between the two electrodes).

In step four (FIG. 15.4), the oxide layers 1545 and 1541 and silicon mass layer 1540 are patterned using a proper mask to define the top electrode (the remaining mass layer 1540 in FIG. 15.4. At the same time, the spring anchors 1530 are also formed.

In step five (FIG. 15.5), a prime wafer 1501 with an insulation layer 1515 is bonded to the spring anchors 1530. The prime wafer 1501 will become the substrate for the final transducer.

In step six (FIG. 15.6), the handle wafer and the box (oxide) layer of the SOI wafer 1529 are removed to leave the spring layer 1520 (membrane layer) in the transducer to be formed. Note that the drawing in FIG. 15.6 is flipped upside down from the drawing in FIG. 15.5.

In step seven (FIG. 15.7), openings 1525 are etched to access the top electrode (the mass layer 1540). In the step, vias may also be etched to form interconnection to the bottom electrode if needed.

In step eight (FIG. 15.8), a metal layer 1555 is deposited and patterned to form top electrode connections. In addition, trenches 1545 may be etched to isolate the cMUT elements.

FIGS. 16.1-16.7 show a second exemplary fabrication process for making a micro-electro-mechanical transducer in accordance with the present disclosure. The steps of the process are described below.

In step one (FIG. 16.1), an insulation layer 1615 is deposited and patterned on a substrate wafer 1601.

In step two (FIG. 16.2), a sacrificial layer 1681 is deposited and patterned over the insulation layer 1615.

In step three (FIG. 16.3), a mass layer 1640 (to become the top electrode in this embodiment) is deposited and patterned over the sacrificial layer 1681. The mass layer 1640 may be conductive to serve as the top electrode in the final transducer.

In step four (FIG. 16.4), another sacrificial layer 1682 is deposited and patterned over the mass layer 1640 and the first sacrificial layer 1681. The pattern of the second sacrificial layer 1682 defines a negative pattern (the recess) for the spring-mass connector to be formed.

In step five (FIG. 16.5), a material is deposited into the pattern of the sacrificial layer 1682 to form a spring layer 1620 and spring-mass connectors 1650. Vias (not shown) are also opened for the sacrificial layer removal.

In step six (FIG. 16.6), the sacrificial layers 1681 and 1682 are removed. The vias are sealed. New vias 1621 are opened to access the top electrode 1640 (the conductive mass layer 1640) and the bottom electrode (not shown). If the spring layer 1620 is conductive, the vias 1621 may not be needed.

In step seven (FIG. 16.7), a metal layer 1625 is deposited and patterned for interconnections. Trenches are etched between cMUT elements to separate the individual cMUT elements if needed.

FIGS. 17.1-17.5 show a third exemplary fabrication process for making a micro-electro-mechanical transducer in accordance with the present disclosure. The steps of the process are described below.

In step one (FIG. 17.1), the process starts with a transducer made from either the above described process in FIGS. 15.1-15.8 or the process in FIGS. 16.1-16.7. The transducer itself may already be a functional transducer. However, additional steps in the process described in FIGS. 17.1-17.5 introduce features that may enhance the performance of the transducer. In addition, this additional process may also be used to further fabricate a different cMUT structure such as produced by the process described in FIGS. 19.1-19.4 below.

The starting transducer has substrate 1701 connected to spring layer 1720 through spring anchors 1730. An insulator layer 1715 is also included. A first mass layer 1742 has already been formed and is connected to the spring layer 1720.

In step two (FIG. 17.2), a prime wafer 1740 is patterned and etched to form a surface pattern including posts 1750 which will become spring-mass connectors 1750. Prime wafer 1740 will become a second mass layer as illustrated below. Alternatively, an SOI wafer instead of a prime wafer may be used for the same purpose.

In step three (FIG. 17.3), the prime wafer 1740 is bonded to the spring layer 1720 through the spring-mass connectors 1750.

In step four (FIG. 17.4), the prime wafer 1740 is a ground and polished to a desired thickness to form a second played layer 1740 which will be the top surface plate of the final transducer.

In step five (FIG. 17.5), trenches 1745 are etched between cMUT elements to separate individual cMUT elements.

FIGS. 18.1-18.5 show a fourth exemplary fabrication process for making a micro-electro-mechanical transducer in accordance with the present disclosure. The steps of the process are described below.

In step one (FIG. 18.1), similar to the process described above in FIGS. 17.1-17.5, the process here also starts with a transducer made from either the above described process in FIGS. 15.1-15.8 or the process in FIGS. 16.1-16.7. The starting transducer has substrate 1801 connected to spring layer 1820 through spring anchors 1830. An insulator layer 1815 is also included. A first mass layer 1842 has already been formed and is connected to the spring layer 1820.

In step two (FIG. 18.2), a sacrificial layer 1881 is deposited and patterned over the spring layer 1820 to form a pattern 1882 which is a negative of the new spring-mass connectors to be formed.

In step three (FIG. 18.3), a surface plate layer 1840 is deposited over the sacrificial layer 1881 and the pattern 1882

In step four (FIG. 18.4), the sacrificial layer 1881 is removed to form the surface plate 1840 and the spring-mass connector 1850.

In step five (FIG. 18.5), trenches are etched between cMUT elements to separate individual cMUT elements.

The fabrication processes described above in FIGS. 17.1-17.5 and FIGS. 18.1-18.5 may also be used to fabricate a precursor to start with in a fabrication process to make other types of cMUT structures.

FIGS. 19.1-19.4 show an exemplary process for forming a precursor cMUT structure to be further processed using the fabrication methods in accordance with the present disclosure. The steps of the process are described below.

In step one (FIG. 19.1), an oxide 1930 is grown and patterned on the substrate 1901 to form spring anchors and to define a transducing gap.

In step two (FIG. 19.2), an SOI wafer 1929 including a desired spring layer 1920 (membrane layer) is bonded over the spring anchors 1930.

In step three (FIG. 19.3), the handle wafer and the box layer (oxide) of the SOI wafer 1929 are removed to leave the spring layer 1920 on the spring anchors 1930.

In step four (FIG. 19.4), a metal layer 1925 is deposited and patterned to form a top electrode.

The resultant structure may be used as a starting structure for the fabrication processes described above in FIGS. 17.1-17.5 and FIGS. 18.1-18.5 to fabricate a cMUT structure similar to that shown in FIG. 17.5 and FIG. 18.5 but without an extra mass layer 1742 or 1842.

FIGS. 20.1-20.9, including supplemental FIGS. 20.7a, 20.7b, 20.7c and 20.7d, show a fifth exemplary fabrication process for making a micro-electro-mechanical transducer in accordance with the present disclosure. The steps of the process are described below.

In step one (FIG. 20.1), the process starts with an SOI wafer 2049 with a desired surface plate layer 2040. The mass layer 2040 is patterned to form the surface plate (mass layer) and to define the height of the motion stoppers. Alternatively, this step may start with a prime wafer with an oxide layer. The prime wafer can be ground and polished to a desired thickness to form the surface plate 2040 in a subsequent step.

In step two (FIG. 20.2), the surface plate 2040 is patterned to define the spring-mass connectors 2050 and the motion stoppers 2051.

In step three (FIG. 20.3), a second SOI wafer 2029 including a spring layer 2020 is bonded over the spring-mass connectors 2050.

In step four (FIG. 20.4), the handle wafer and the oxide layer (box layer) of the SOI wafer 2029 is etched back and removed to form the spring layer 2020. If needed, silicon doping can be performed in selected areas on the spring layer 2020.

In step five (FIG. 20.5), recess pattern 2021 is made on the spring layer 2020 for insulation extension. This step may be done with methods described in International Application (PCT) No. PCT/IB2006/051948, entitled MICRO-ELECTRO-MECHANICAL TRANSDUCER HAVING AN INSULATION EXTENSION, filed on Jun. 16, 2006, which patent application is fully incorporated herein by reference.

In step six (FIG. 20.6), spring anchor 2030 including an insulation extension is formed in the recesses 2021 by thermal oxide growth and patterning. The insulation extension of the spring anchor 2030 extends into the spring layer 2020 to enhance insulation performance without having to increase the separation width between the two electrodes. Spring anchor 2030 stands from the bottom the recesses 2021 and stands above the spring layer 2020. The portion of the spring anchor 2030 extending into the recesses 2021 forms an insulation extension, while the portion above the recesses serve as the spring anchor and to define the transducing gap between electrodes.

In step seven (FIG. 20.7), a prime wafer including substrate 2001 is bonded to the resultant wafer from the previous step. Note the drawing in FIG. 20.7 has been flipped upside down from the drawing in FIG. 20.6. Before bonding, an insulation layer may be grown if needed. In this example, the substrate may be a conductive material and may serve as the bottom electrode. Several options are available in this step. These options are described later after the main process has been described.

In step eight (FIG. 20.8), the handle wafer and the oxide layer (box layer) of the SOI wafer 2049 is etched and removed to form the surface plate 2040. If needed, the surface plate 2040 may be patterned to form a desired configuration. For example, the surface plate 2040 may be made into a shape profile having non-uniform thickness. It may also be made into a hollow structure having holes are cavities therein.

In step nine (FIG. 20.9), a metal layer is deposited and patterned to form a top electrode. Trenches may be etched between elements or at the element (device) boundary to separate the individual cMUT elements. The trenches may be sealed by the methods described in the several patent applications referenced to and incorporated herein, particularly in International Application (PCT) No. PCT/IB2006/051567, entitled METHODS FOR FABRICATING MICRO-ELECTRO-MECHANICAL DEVICES, filed on May 18, 2006; and U.S. patent application Ser. No. 11/425,128, entitled FLEXIBLE MICRO-ELECTRO-MECHANICAL TRANSDUCER, filed on Jun. 19, 2006, which patent applications are fully incorporated herein by reference.

Several options are available in step seven. FIG. 20.7a shows a first option in which resultant wafer 2049 from the previous step (FIG. 20.6) is bonded to a wafer 2001a having pattered bottom electrodes 2012. FIG. 20.7b shows a second option in which resultant wafer 2049 from the previous step (FIG. 20.6) is bonded to a wafer 2001b having through wafer interconnection structures 2005. FIG. 20.7c shows a third option in which resultant wafer 2049 from the previous step (step 20.6) is bonded to a special material (e.g., glass, sapphire, or silicon) wafer 2001c with a desired metal and metal pattern 2006 or with a PCB board with desired circuit. FIG. 20.7d shows a fourth option in which resultant wafer 2049 from the previous step (FIG. 20.6) is bonded to a wafer 2001d having integrated circuits (ICs) built in. After the optional step (step seven), the process content is to step eight to finish the fabrication.

FIGS. 21.1-21.9, including supplemental FIGS. 21.8a, 21.9a, 21.1a and 21.9b, show a sixth exemplary fabrication process for making a micro-electro-mechanical transducer in accordance with the present disclosure. The steps of the process are described below.

In step one (FIG. 21.1), recess pattern 2131 is made on substrate 2101 for insulation extension. This step, and the following step two and step three, may be done with methods described in International Application (PCT) No. PCT/IB2006/051948, entitled MICRO-ELECTRO-MECHANICAL TRANSDUCER HAVING AN INSULATION EXTENSION, filed on Jun. 16, 2006, which patent application is fully incorporated herein by reference.

In step two (FIG. 21.2), an oxide is grown and patterned to form spring anchor 2130 including insulation extension.

In step three (FIG. 21.3), optionally an insulation layer is grown and patterned around the oxide spring anchor 2130 including insulation extension.

In step four (FIG. 21.4), an SOI wafer 2129 including a spring layer (membrane layer) 2120 is bonded to the spring anchor 2130.

In step five (FIG. 21.5), the handle wafer and the oxide layer (box layer) of the SOI wafer 2129 is etched back and removed to form the spring layer 2120. If desired, silicon doping may be done in selected areas on the spring layer 2120.

In step six (FIG. 21.6), spring-mass connectors 2150 are formed on the spring layer 2120.

In step seven (FIG. 21.7), the resultant wafer from the previous step is bonded to another SOI wafer 2149. Alternatively, a prime wafer may be used instead.

In step eight (FIG. 21.8), the handle wafer and the oxide layer (box layer) of the SOI wafer 2149 is etched and removed to form the surface plate 2140. If needed, the silicon doping can be done in selected areas on the surface plate 2140.

In step nine (FIG. 21.9), a metal layer is deposited to form the top electrode 2160. Trenches 2145 may be etched between cMUT elements or at the element (device) boundary to separate the individual cMUT elements. The trenches may be sealed (not shown) by the methods described in International Application (PCT) No. PCT/IB2006/051567, entitled METHODS FOR FABRICATING MICRO-ELECTRO-MECHANICAL DEVICES, filed on May 18, 2006; and U.S. patent application Ser. No. 11/425,128, entitled FLEXIBLE MICRO-ELECTRO-MECHANICAL TRANSDUCER, filed on Jun. 19, 2006, which patent applications are fully incorporated herein by reference.

FIG. 21.8a shows an optional step which can be performed in the above step eight (FIG. 21.8). In this optional step, the surface plate 2140a is patterned to form patterns 2141. Following this step, a metal layer is deposited and patterned over the surface plate 2140a to finish the process as shown in FIG. 21.9a.

FIG. 21.1a shows an optional step which can be performed after the above step one (FIG. 21.1). In this optional step, the substrate 2101 is shaped (bent) to a desired shape. This step may be done with the methods described in International Application (PCT) PCT/IB2006/052657, entitled MICRO-ELECTRO-MECHANICAL TRANSDUCER HAVING AN OPTIMIZED NON-FLAT SURFACE, filed on Aug. 3, 2006.

After the optional step in FIG. 21.1a, the process continues to FIG. 21.2 to complete the process. FIG. 21.9b shows a final cMUT structure produced by the process if both the optional step in FIG. 21.1a and the optional step in FIG. 21.8a are performed.

In the foregoing specification, the present disclosure is described with reference to specific embodiments thereof, but those skilled in the art will recognize that the present disclosure is not limited thereto. Various features and aspects of the above-described disclosure may be used individually or jointly. Further, the present disclosure can be utilized in any number of environments and applications beyond those described herein without departing from the broader spirit and scope of the specification. We claim all such modifications and variations that fall within the scope and spirit of the claims below. The specification and drawings are, accordingly, to be regarded as illustrative rather than restrictive. It will be recognized that the terms "comprising," "including," and "having," as used herein, are specifically intended to be read as open-ended terms of art.

What is claimed is:

1. A method for fabricating a micro-electro-mechanical device having a movable mechanical part to transform energy, the method comprising the steps of:
    forming at least one spring anchor on either a front side of a substrate wafer or a bottom side of a spring layer;
    forming at least one spring-mass connector of a desired height either on the spring layer or on a mass layer; and
    joining the substrate wafer, the spring layer and the mass layer such that the spring layer and the substrate wafer are joined through the spring anchor to define a gap therebetween, the mass layer and the spring layer are joined through the spring-mass connector.

2. The method of claim 1 wherein the step of joining the substrate wafer, the spring layer and the mass layer comprises a step using wafer bonding technique.

3. The method of claim 1 wherein the spring-mass connector may be horizontally distanced from the spring anchor by a sufficient length to define a cantilever anchored at the spring anchor with an exerting end at the spring-mass connector, the cantilever and the gap enabling a vertical displacement of the spring-mass connector to transport the mass layer substantially vertically with a piston-like motion.

4. The method of claim 1 wherein spring-mass connector is formed on a top side of the spring layer, and the mass layer is connected to the spring-mass connector from the top side of the spring layer opposing the substrate wafer.

5. The method of claim 1 wherein spring-mass connector is formed on the bottom side of the spring layer, and the mass layer is connected to the spring-mass connector from the bottom side of the spring layer.

6. The method of claim 5 wherein the mass layer is disposed in the gap defined by the spring layer and the substrate wafer.

7. The method of claim 1, wherein the step of forming at least one spring anchor comprises:
    depositing and patterning a material on the spring layer or the substrate wafer to form the at least one spring anchor.

8. The method of claim 1, wherein the step of forming at least one spring anchor comprises:
    growing and patterning an oxide on the spring layer or the substrate wafer to form the at least one spring anchor.

9. The method of claim 1, wherein the step of forming at least one spring anchor comprises:
   forming a recess on the spring layer or the substrate wafer; and
   growing and patterning an oxide on the spring layer or the substrate wafer to form the at least one spring anchor in the recess, the spring anchor attaching to a bottom of the recess and extending beyond the spring layer or the substrate wafer.

10. The method of claim 1, wherein the step of forming at least one spring-mass connector comprises:
    depositing and patterning a material on the mass layer or the spring layer to form the at least one spring-mass connector.

11. The method of claim 1, wherein the step of forming at least one spring-mass connector comprises:
    patterning and micromachining the mass layer or the spring layer to form the at least one spring-mass connector on the mass layer.

12. The method of claim 1, wherein the step of forming at least one spring-mass connector comprises:
    forming a sacrificial layer on the mass layer or the spring layer, the sacrificial layer defining a negative pattern for the spring-mass connector;
    depositing a material over the sacrificial layer and into the negative pattern for the spring-mass connector; and
    removing the sacrificial layer to form the spring layer and the spring-mass connector.

13. The method of claim 1 further comprising forming or effectuating a transducing member on the spring layer.

14. The method of claim 13 wherein the transducing member is an electrode.

15. The method of claim 1 wherein the mass layer is disposed between the substrate and the spring layer, the method further comprising forming or effectuating a transducing member on the mass layer.

* * * * *